United States Patent
Sato

(10) Patent No.: US 9,276,378 B2
(45) Date of Patent: Mar. 1, 2016

(54) SURFACE EMITTING LASER ELEMENT AND ATOMIC OSCILLATOR

(75) Inventor: Shunichi Sato, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/123,825

(22) PCT Filed: Jun. 29, 2012

(86) PCT No.: PCT/JP2012/067248
§ 371 (c)(1),
(2), (4) Date: Dec. 4, 2013

(87) PCT Pub. No.: WO2013/005813
PCT Pub. Date: Jan. 10, 2013

(65) Prior Publication Data
US 2014/0133510 A1    May 15, 2014

(30) Foreign Application Priority Data

Jul. 7, 2011  (JP) .................. 2011-151279
Apr. 24, 2012  (JP) .................. 2012-099107
Jun. 27, 2012  (JP) .................. 2012-144692

(51) Int. Cl.
*H01S 5/187*    (2006.01)
*G04F 5/14*    (2006.01)
*H01S 5/42*    (2006.01)
(Continued)

(52) U.S. Cl.
CPC .............. *H01S 5/187* (2013.01); *B82Y 20/00* (2013.01); *G04F 5/14* (2013.01); *G04F 5/145* (2013.01); *H01S 5/18358* (2013.01); *H01S 5/18394* (2013.01); *H01S 5/423* (2013.01); *H03L 7/26* (2013.01); *H01S 5/005* (2013.01); *H01S 5/18311* (2013.01); *H01S 5/34326* (2013.01); *H01S 5/4087* (2013.01); *H01S 2301/176* (2013.01); *H01S 2301/18* (2013.01)

(58) Field of Classification Search
CPC ............ H01S 5/18369; H01S 5/18394; H01S 2301/18; G04F 5/145
See application file for complete search history.

(56) References Cited

U.S. PATENT DOCUMENTS 6,117,699 A * 9/2000 Lemoff et al. .................. 438/35
6,238,944 B1 5/2001 Floyd
(Continued)

FOREIGN PATENT DOCUMENTS

JP    2751814    5/1998
JP    11-330631    11/1999
(Continued)

OTHER PUBLICATIONS

International Search Report Issued Oct. 9, 2012 in PCT/JP2012/067248 filed on Jun. 29, 2012.
(Continued)

*Primary Examiner* — Yuanda Zhang
*Assistant Examiner* — Michael Carter
(74) *Attorney, Agent, or Firm* — Cooper & Dunham LLP

(57) ABSTRACT

A surface emitting laser element includes a lower DBR formed on a substrate; an active layer formed above the lower DBR; an upper DBR formed on the active layer. The upper DBR includes a dielectric multilayer that is formed as a result of dielectrics having different refractive indexes being alternately laminated and formed, a light shielding part is formed above the upper DBR, and the light shielding part has an opening at a central area for emitting light.

8 Claims, 23 Drawing Sheets

(51) Int. Cl.
*H03L 7/26* (2006.01)
*B82Y 20/00* (2011.01)
*H01S 5/00* (2006.01)
*H01S 5/183* (2006.01)
*H01S 5/343* (2006.01)
*H01S 5/40* (2006.01)

(56) References Cited

U.S. PATENT DOCUMENTS

| | | |
|---|---|---|
| 6,529,541 B1 | 3/2003 | Ueki et al. |
| 2002/0176465 A1* | 11/2002 | Kondow et al. ............... 372/45 |
| 2003/0039294 A1* | 2/2003 | Ueki et al. .................. 372/96 |
| 2004/0028103 A1* | 2/2004 | Ueki ............................ 372/46 |
| 2004/0184500 A1 | 9/2004 | Kuwata |
| 2005/0014349 A1* | 1/2005 | Carey et al. ................ 438/478 |
| 2006/0098706 A1 | 5/2006 | Sato et al. |
| 2008/0232418 A1 | 9/2008 | Anan |
| 2009/0295902 A1 | 12/2009 | Sato et al. |
| 2011/0057737 A1 | 3/2011 | Aoyama et al. |
| 2011/0103420 A1* | 5/2011 | Koda et al. ............... 372/45.01 |

FOREIGN PATENT DOCUMENTS

| | | |
|---|---|---|
| JP | 2000-058958 | 2/2000 |
| JP | 2002-208755 | 7/2002 |
| JP | 2004-288674 | 10/2004 |
| JP | 2006-135226 | 5/2006 |
| JP | 2007-059770 | 3/2007 |
| JP | 2008-053353 | 3/2008 |
| JP | 2008-283129 | 11/2008 |
| JP | 2009-188598 | 8/2009 |
| JP | 2011-142209 | 7/2011 |
| WO | WO 2005/071808 A1 | 8/2005 |

OTHER PUBLICATIONS

Svenja Knappe et al. "A microfabricated atomic clock" Applied Physics Letters, vol. 85, No. 9, pp. 1460-1462 (2004).
Svenja Knappe, "3.18 MEMS Atomic Clocks" Comprehensive Microsystems, vol. 3, pp. 571-612.
Darwin K. Serkland. "VCSELs for Atomic Clocks" Proc. of SPIE vol. 6132 613208-1 (2006).
May 7, 2015 partial supplementary European search report in corresponding European patent application No. 12807195.8.
European search report dated Nov. 11, 2015 in corresponding European Patent Application No. 12807195.8.

* cited by examiner

*prior art*

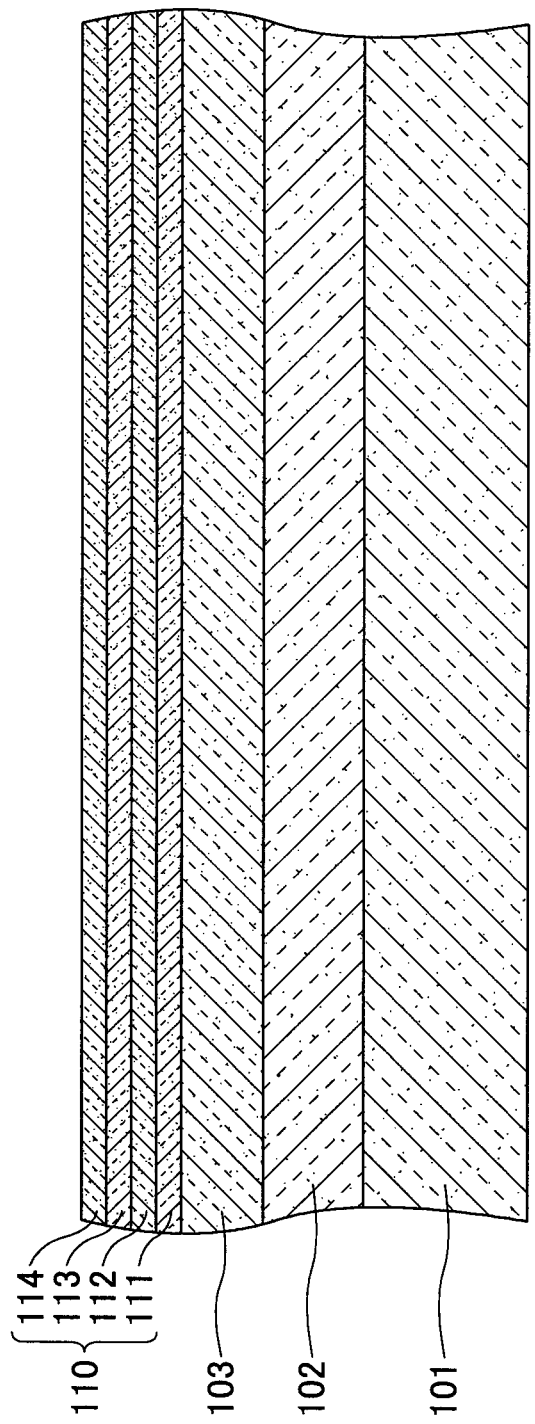

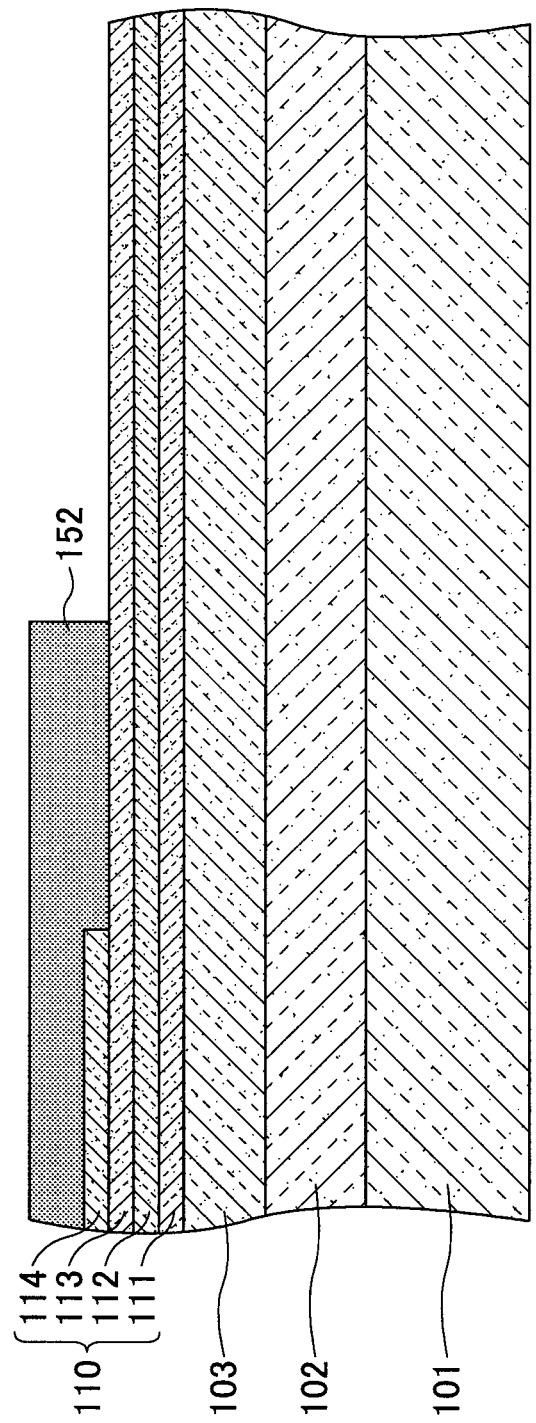

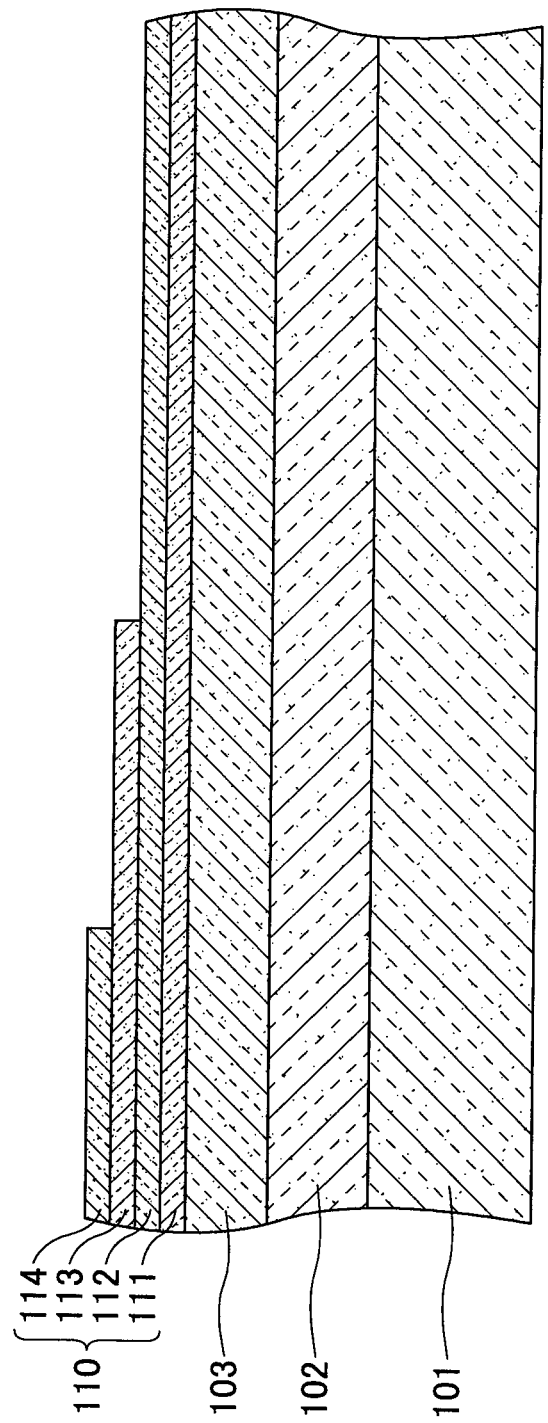

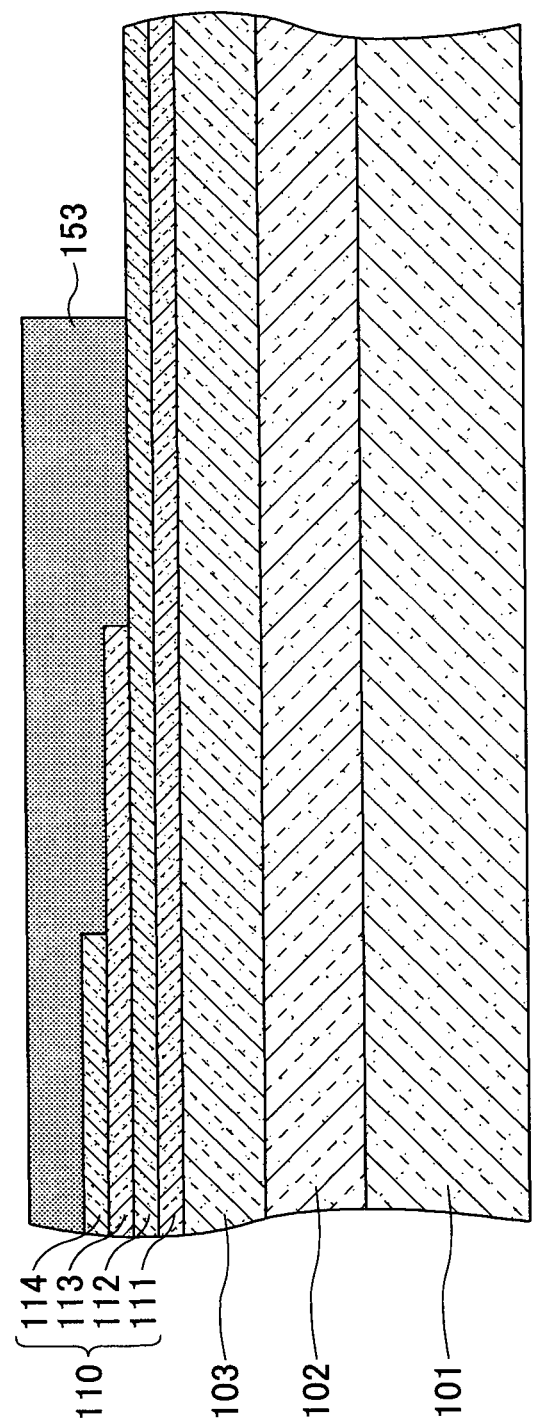

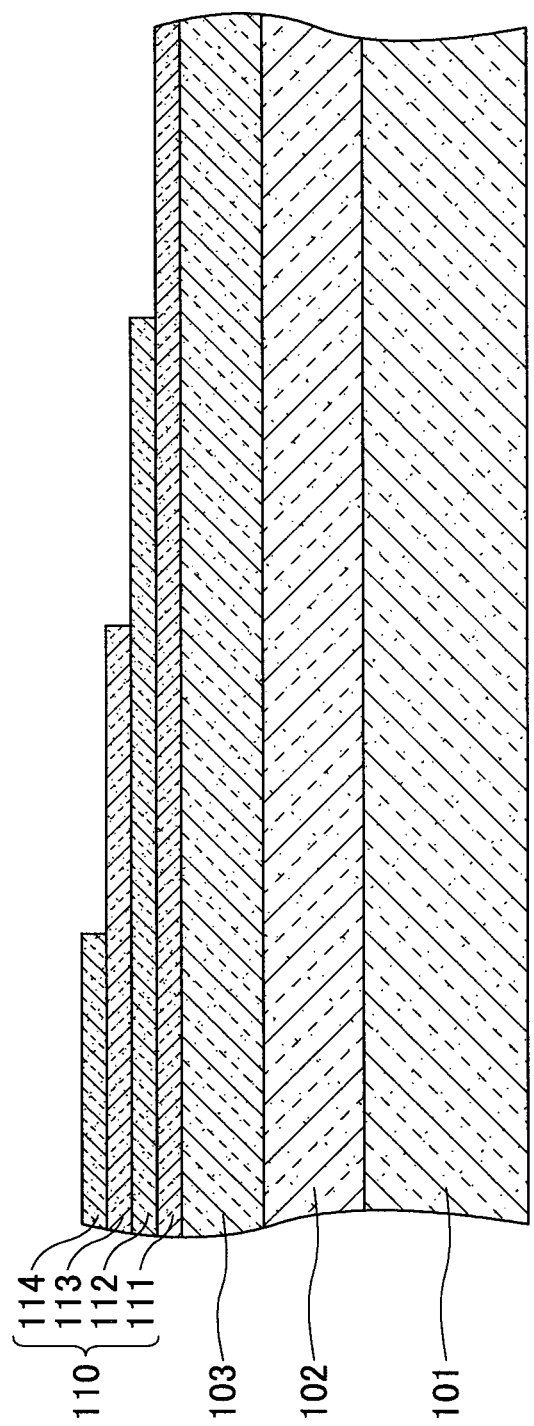

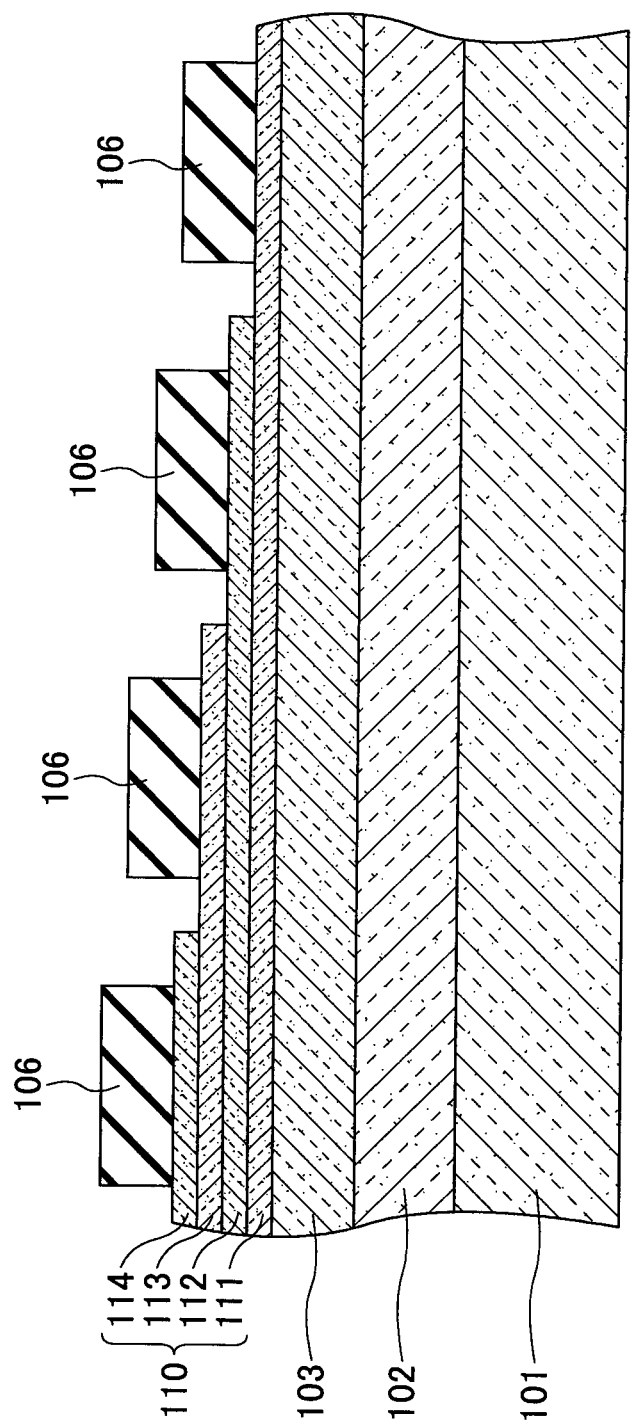

SURFACE EMITTING LASER ELEMENT AND ATOMIC OSCILLATOR

TECHNICAL FIELD

The present invention relates to a surface emitting laser element and an atomic oscillator.

BACKGROUND ART

A vertical cavity surface emitting laser (VCSEL) is a semiconductor laser emitting light in a direction perpendicular to a substrate surface, and in comparison to an edge emitting type semiconductor laser, has features of low cost, low power consumption, small-sized, high-performance, and being able to be easily integrated two-dimensionally.

A vertical cavity surface emitting laser has a resonator structure including a resonator area that includes an active layer, and an upper reflecting mirror and a lower reflecting mirror provided above and below the resonator area, respectively (see Patent document No. 1, mentioned later). Accordingly, the resonator area is formed to have a predetermined optical thickness such that resonance of light of a wavelength λ occurs in the resonator area in order to obtain light of the oscillation wavelength λ. The upper and lower reflecting mirrors are formed by alternately laminating and forming materials having different refractive indexes, i.e., a low refractive index material(s) and a high refractive index material(s). In order to obtain high reflectance at the wavelength of λ, the upper and lower reflecting mirrors are formed in such a manner that the optical thickness of the low refractive index material(s) and the high refractive index material(s) is λ/4. It has also been proposed to form elements having different wavelengths in a chip (see Patent documents Nos. 2, 3, 4 and 7, mentioned later).

An atomic clock (atomic oscillator) is a clock that can measure time very precisely. The technology of miniaturizing and so forth of an atomic clock has been studied. An atomic clock is an oscillator that is based on transition energy amounts of electrons included in atoms such as an alkali metal. In particular, it is possible to obtain a very precise value of transition energy in electrons of atoms of an alkali metal in a state of having no disturbance. As a result, it is possible to obtain frequency stability higher by several digits than a crystal oscillator.

From among several types of atomic clocks, an atomic clock of a Coherent Population Trapping (CPT) system has frequency stability higher than a crystal oscillator by an order of about three digits in comparison to a crystal oscillator of the prior art, and it is possible to expect an extremely compact size and extremely low power consumption (see Non-patent documents Nos. 1 and 2, and Patent document No, 5, mentioned later).

An atomic clock of a CPT system has, as shown in FIG. 1, a light source 910 of a laser element or the like, an alkali metal cell 940 in which an alkali metal is sealed, and a light detector 950 that receives laser light that has been transmitted by the alkali metal cell 940. The laser light is modulated, and two transitions of electrons in alkali metal atoms are carried out simultaneously at side band wavelengths that appear on both sides of a carrier wave that is a specific wavelength, whereby the laser light is excited. The transition energy in the transitions does not change, and a transparency phenomenon of absorptivity of light being reduced in the alkali metal occurs when the side band wavelengths coincide with the wavelengths corresponding to the transitions. In the atomic clock, the wavelength of the carrier wave is adjusted so that the absorptivity of light of the alkali metal is thus reduced, and a signal detected in the light detector 950 is fed back to the modulator 960. The modulation frequency of the laser light that is emitted from the light source 910 such as a laser element is thus adjusted by the modulator 960. It is noted that the laser light is emitted from the light source 910, and is incident on the alkali metal cell 940 through a collimator lens 920 and a λ/4 plate 930.

In FIG. 1, MF denotes a magnetic field; L denotes the optical path length of laser light passing through the alkali metal; D denotes a diameter of the laser light; and X denotes a distance.

As a light source of such an extremely small-sized atomic clock, a vertical cavity surface emitting laser that is small-sized, having extremely low power consumption, and having high wavelength quality is suitable. As wavelength accuracy of a carrier wave, ±1 nm with respect to a specific wavelength is needed (see Patent document No. 3).

The frequency stability of an atomic clock is limited by either the shorter of the diameter D or the optical path length L of the laser light passing through the alkali metal cell 940. The shorter either the shorter of the diameter D or the optical path length L becomes, the worse the stability becomes. Accordingly, it is preferable that the diameter D of the laser light is as large as possible.

However, the divergence angle of laser light of a vertical cavity surface emitting laser is narrower than an edge emitting type laser. Accordingly, in a case where the frequency stability is to be increased, it is necessary to elongate the distance X between the light source 910 and the collimator lens 920 in order to increase the diameter D of the laser light passing through the alkali metal cell 940. Thus, in a case where a vertical cavity surface emitting laser is used as the light source 910, it may be difficult to satisfy both miniaturization of the atomic clock and high frequency stability.

Further, manufacturing a large number of vertical cavity surface emitting lasers that oscillate at the same wavelength may be difficult due to an influence of a variation in growth speed, a variation in distribution of a film thickness and so forth of a semiconductor layer during manufacture. Thus, vertical cavity surface emitting lasers may have a problem concerning reproducibility and uniformity in vertical cavity surface emitting lasers thus manufactured. Specifically, a film formed by a common Metal Organic Chemical Vapor Deposition (MOCVD) apparatus or a Molecular Beam Epitaxy (MBE) apparatus has film thickness uniformity on the order of 1% through 2%. As a result, in a case where a film having a thickness the same as a wavelength 850 nm is formed, an in-plane distribution of 8.5 nm through 17 nm may occur. Thus, for uses for which on the order of ±1 nm with respect to a wavelength is needed, yield may be reduced, and cost may be increased.

SUMMARY OF INVENTION

According to one aspect, a surface emitting laser element has a lower distributed Bragg reflector (DBR) formed on a substrate; an active layer formed above the lower DBR, and an upper DBR formed above the active layer. The upper DBR includes a dielectric multilayer that is made of dielectrics having different refractive indexes being alternately laminated and formed. A light shielding part is formed above the upper DBR, and an opening to emit light is formed at the center of the light shielding part.

According to another aspect, a surface emitting laser element has a lower DBR formed on a substrate; an active layer formed above the lower DBR and an upper DBR formed above the active layer. The upper DBR includes a dielectric multilayer that is made of dielectrics having different refractive indexes being alternately laminated and formed. A light shielding part is formed above the active layer and below the dielectric ultilayer, and an opening to emit light is formed at the center of the light shielding part.

Other objects, features and advantages of the present invention will become more apparent from the following detailed description when read in conjunction with the accompanying drawings.

BRIEF DESCRIPTION OF DRAWINGS

FIGS. 8A, 8B and 8C illustrate a manufacturing method for the surface emitting laser element according to the second embodiment (1);

FIGS. 9A, 9B and 9C illustrate a manufacturing method for the surface emitting laser element according to the second embodiment (2);

FIGS. 10A and 10B illustrate a manufacturing method for the surface emitting laser element according to the second embodiment (3);

DESCRIPTION OF EMBODIMENTS

Figure 1:
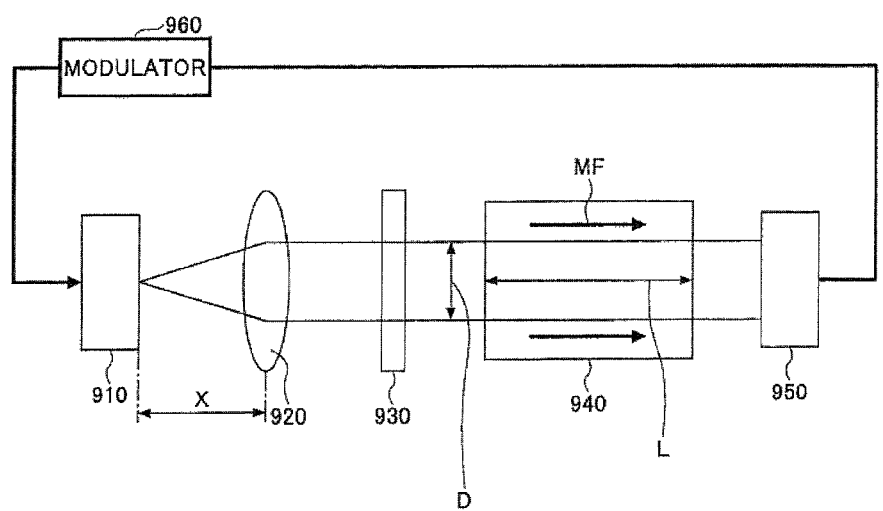
FIG. 1 illustrates an atomic oscillator.

Embodiments of the present invention will be described. It is noted that the same reference numerals are given to the same members or the like, and duplicate description will be omitted.

First Embodiment

Figure 2:
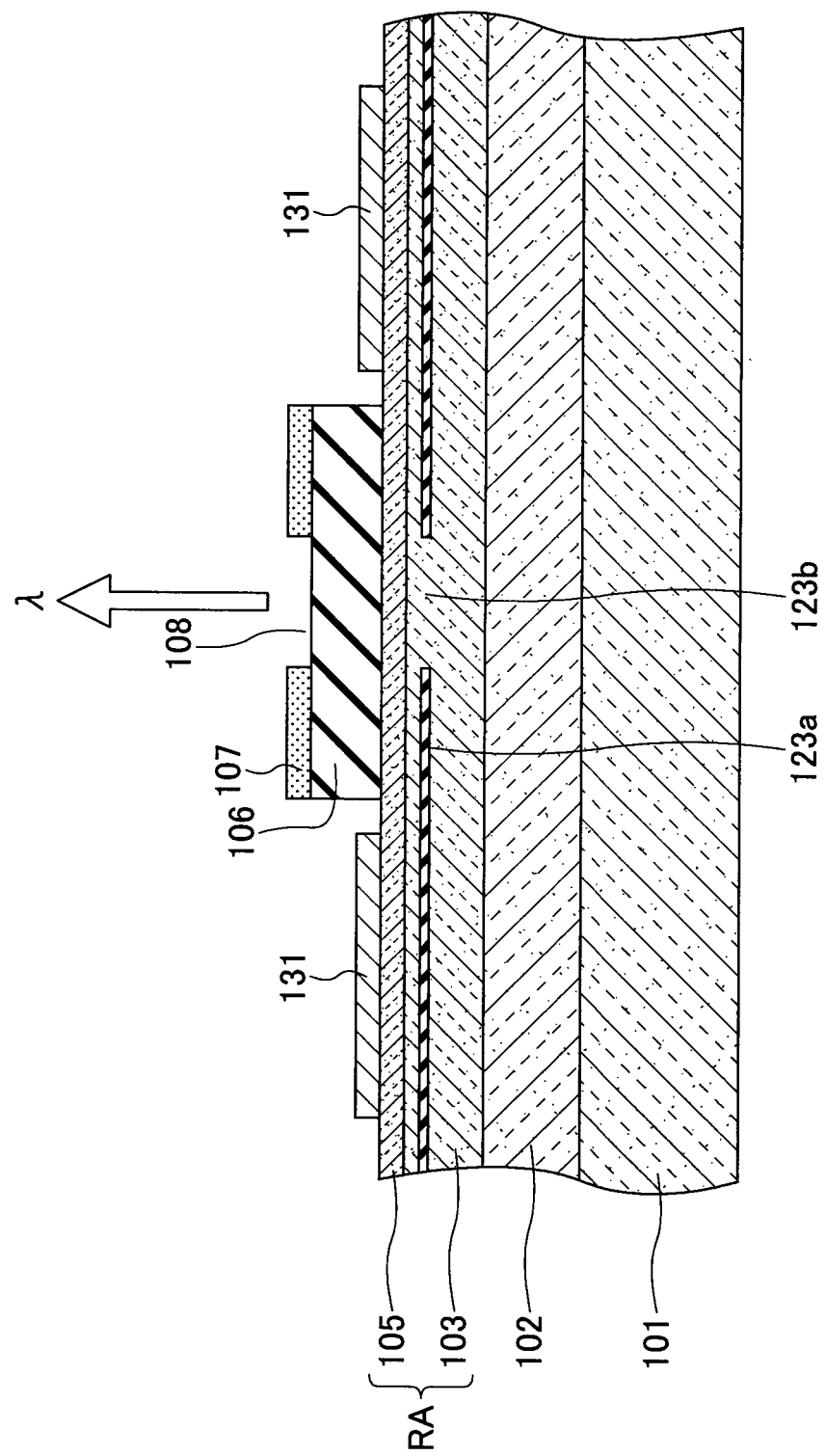
FIG. 2 is a configuration diagram of a surface emitting laser element according to a first embodiment.

Based on FIG. 2, a surface emitting laser element according to a first embodiment will be described. The surface emitting laser element according to the first embodiment is formed as a result of a lower DBR 102, an active layer 103, a contact layer 105 and an upper DBR 106 being laminated on a substrate 101 made of a semiconductor or the like. On the upper DBR 106, a light shielding part 107 is formed.

The lower DBR 102 is formed as a result of semiconductor layers having different refractive indexes being alternately laminated.

The active layer 103 is formed to have a predetermined thickness on the lower DBR 102, and a current confining layer is formed inside. The current confining layer has a selectively oxidized area 123a that is selectively oxidized from the outside around it and a current confining area 123b not selectively oxidized, and an electric current flows through the current confining area 123b in a concentrated manner.

The contact layer 105 is formed on the active layer 103, and is formed of a semiconductor material. It is noted that the lower DBR 102, the active layer 103 and the contact layer 105 are formed by epitaxial growth, and a resonator area RA is formed by the active layer 103 and the contact layer 105.

The upper DBR 106 is formed on the contact layer 105. The upper DBR 106 is made of dielectric films of oxides, nitrides, fluorides and/or the like, and is formed as a result of a high refractive index film(s) and a low refractive index film(s) being alternately laminated. It is noted that according to the first embodiment, the lower DBR 102 and the upper DBR 106 have functions of mirrors, and therefore, the lower DBR 102 may be referred to as a "lower reflecting mirror" and the upper DBR 106 may be referred to as an "upper reflecting mirror".

In the surface emitting laser element according to the first embodiment, the wavelength of laser light to be emitted is approximately determined by a thickness of the resonator area RA between the lower DBR 102 and the upper DBR 106.

Further, an upper electrode 131 is formed on the contact layer 105 around the upper DBR 106. A structure is provided in which an electric current is supplied to the active layer 103 between a lower electrode (not shown) formed on the back side of the substrate 101 or the like and the upper electrode 131. It is noted that the position of the lower electrode is not limited to the above-mentioned back side of the substrate 101, and the lower electrode may be provided on the top side of the substrate as long as it is possible to supply an electric current to the active layer 103.

Further, the light shielding part 107 is formed on the upper DBR 106 in the surface emitting laser element according to the first embodiment. The light shielding part 107 has an opening 108 at the center of the upper DBR 106. The light shielding part 107 is formed of a metal material, and is formed of, for example, a laminated film of Cr (lower layer) and Au (upper layer), or the like. Accordingly, in the surface emitting laser element according to the first embodiment, light of a wavelength of λ is emitted from the opening 108. It is noted that the reason for using Cr as the lower layer is to increase adhesive properties between the light shielding part 107 and the dielectric film included in the upper DBR 106. It is also possible to use Ti or the like instead of Cr. By thus forming the light shielding part 107 having the opening 108 above the upper DBR 106, it is possible to increase the divergence angle of light that is emitted from the opening 108.

Figure 3:
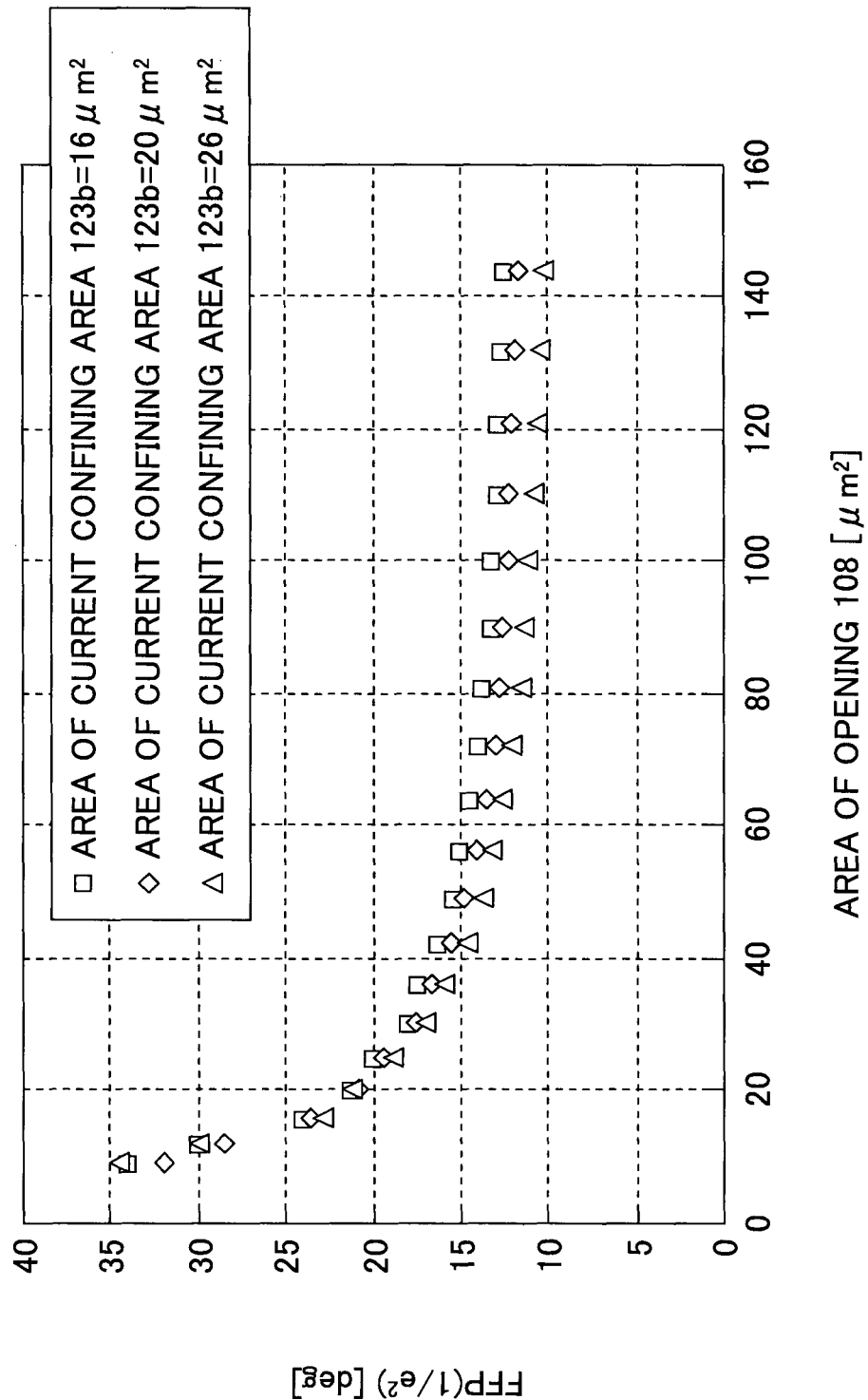
FIG. 3 is a correlation diagram (1) between an area of an opening and FFP.

This point will now be described based on FIG. 3. FIG. 3 shows relationships between the area of the opening 108 and a Far Field Pattern (FFP, which may be referred to as a "divergence angle" according to the first embodiment), and shows cases where the area of the current confining area 123b is changed. It is noted that for the purpose of convenience, FIG. 3 is based on the condition that the oscillation wavelength of the vertical cavity surface emitting laser is 780 nm (corresponding to the D2 line of Rb in an atomic oscillator described later), the upper DBR is formed by a laminated film of semiconductor materials having different refractive indexes, and FFP is a value at $1/e^2$. Both the current confining area 123b and the opening 108 are formed to have rectangular shapes. The output of laser light is 0.3 mW, and is obtained through operations in the fundamental mode.

As shown in FIG. 3, the value of FFP is low as the area of the opening 108 is large, and the value of FFP is increased as the area of the opening 108 is reduced. Accordingly, it is possible to increase the value of FFP, and thus, it is possible to increase the divergence angle, by reducing the area of the opening 108. In the case of FIG. 3, when the area of the opening 108 is less than or equal to 20 μm$^2$, the value of FFP becomes greater than or equal to 20°. When the area of the opening 108 is less than or equal to 10 μm$^2$, the value of FFP becomes greater than or equal to 30'.

In a common surface emitting laser element, the area of the opening is on the order of 100 μm$^2$, and according to FIG. 3, FFP is on the order of 12'. The distance of the position from the beam exit at which position the beam diameter of ϕ1 mm is obtained is on the order of 4.8 mm. In contrast thereto, in a case where FFP is 20', the distance of the position from the beam exit at which position the beam diameter of ϕ1 mm is obtained can be reduced to on the order of 2.8 mm.

Further, the value of FFP also depends on the area of the current confining area 123b. By reducing the area of the current confining area 123b, it is possible to increase the value of FFP. However, the value of FFP has a higher dependence on the area of the opening 108. It is noted that when the thickness of the oxide film in the selective oxidized area 123a is increased, the confinement of light is increased. Thereby, the value of FFP is increased. However, when the thickness of the oxide film is increased, the surface emitting laser element may become easily destroyed due to possible distortion occurring in the oxide film. FIG. 3 and so forth show a case where the thickness of AlAs that is the layer to be selected and oxidized to form the oxide film in the selective oxidized area 123a is 32 nm.

Figure 4:
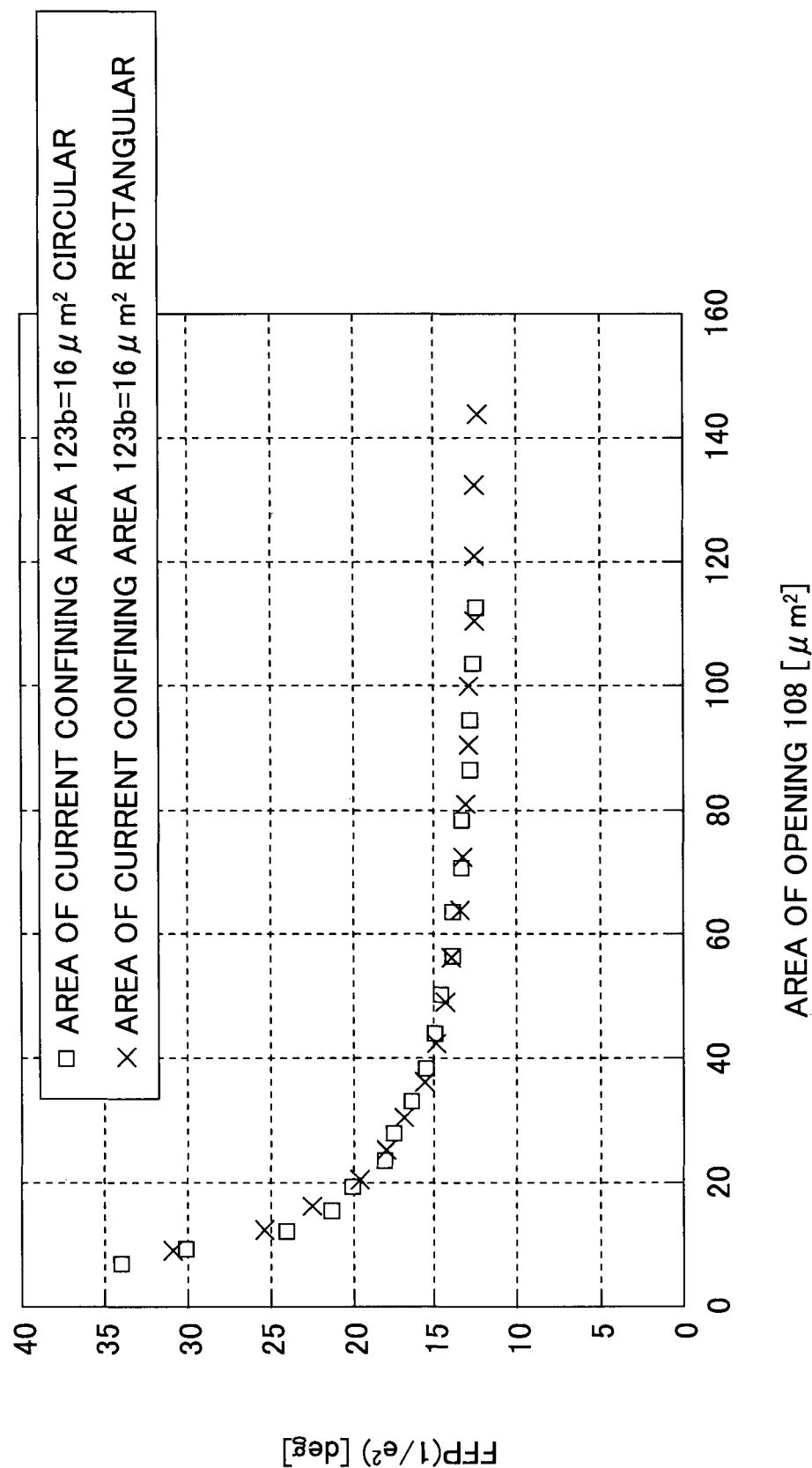
FIG. 4 is a correlation diagram (2) between an area of an opening and FFP.

Further, FIG. 4 shows relationships between the area of the opening 108 and FFP in a case where the shape of the opening 108 is circular and in a case where the shape of the opening 108 is rectangular. As shown in FIG. 4, FFP hardly depends on the shape of the opening 108, however FFP depends on the area of the opening 108.

Figure 5:
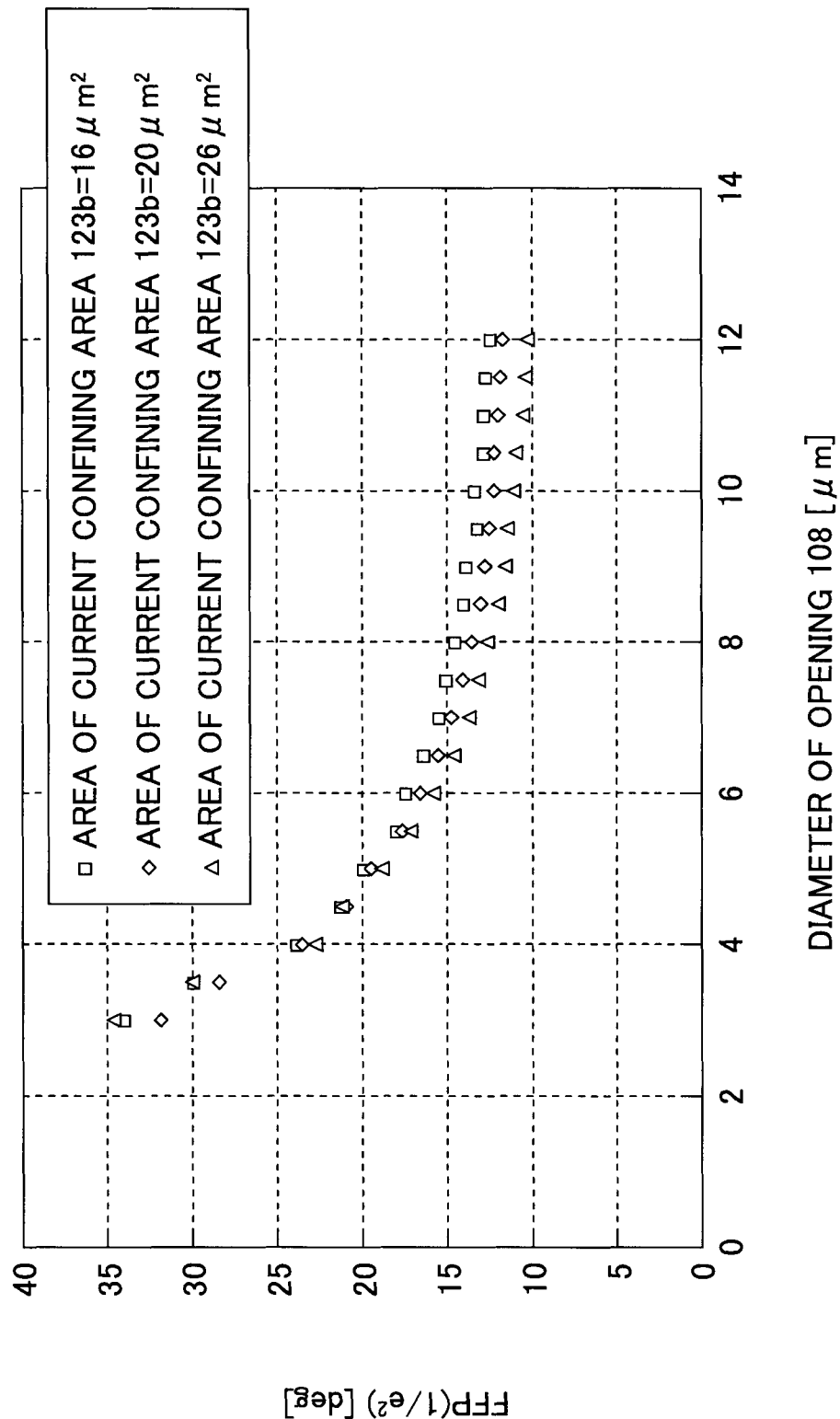
FIG. 5 is a correlation diagram between a diameter of an opening and FFP.

Further, FIG. 5 shows relationships between the diameter of the opening 108 and FFP in a case where the shape of the opening 108 is circular, and shows cases where the area of the current confining area 123b is changed. As the diameter of the opening 108 is reduced, the value of FFP is increased, and thus, a tendency occurs similar to that of the case where the area of the opening 108 is reduced.

Thus, it is possible to increase the divergence angle of laser light emitted from the vertical cavity surface emitting laser by providing the light shielding part 107 having the opening 108. It is noted that the vertical cavity surface emitting laser according to the first embodiment is formed in such a manner that the center of the current confining area 123b and the center of the opening 109 coincide in the light emitting direction.

Further, according to the first embodiment, the light shielding part 107 is formed for blocking light. Accordingly, the function of the light shielding part 107 is not obstructed even when the size of the area on which the upper DBR 106 is formed is reduced, different from a case where the upper electrode is formed on the upper DER 106.

Further, according to the first embodiment, the light shielding part 107 may be formed by using a material that absorbs light. By forming the light shielding part 107 using a material that absorbs light, it is possible to avoid reflection of light from the light shielding part 107, and thus, it is possible to prevent the oscillation conditions in the laser from being changed due to the thus-reflected light.

It is noted that Patent document No. 6 (mentioned later) discusses an example in which a lower DBR, an active layer and an upper DBR are formed by semiconductors, an upper electrode having a narrow opening is formed on the upper DBR, and a fundamental transverse mode output of a vertical cavity surface emitting laser is selectively taken. According to this example, as shown in FIG. 22 of Patent document No. 6, the divergence angle depends on the upper electrode opening diameter, and has a minimum point. The divergence angle is increased as a result of the upper electrode opening being reduced to the same extent as a current injection area. On the other hand, the divergence angle is also increased in a case where the upper electrode opening is wide. This is because of high order mode oscillation. According to the first embodiment, the upper DBR is a dielectric(s), the dielectric exists below the light shielding part, and the light shielding part is not directly in contact with the contact layer. Thus, the configuration of the first embodiment is different from the configuration of Patent document No. 6 in which the upper electrode formed above the contact layer is used as a light shielding part.

According to the first embodiment, it is possible to increase the divergence angle using the light shielding part even in a case where the upper DBR is formed of a dielectric(s).

Second Embodiment

Structure of Surface Emitting Laser Element

Figure 6:
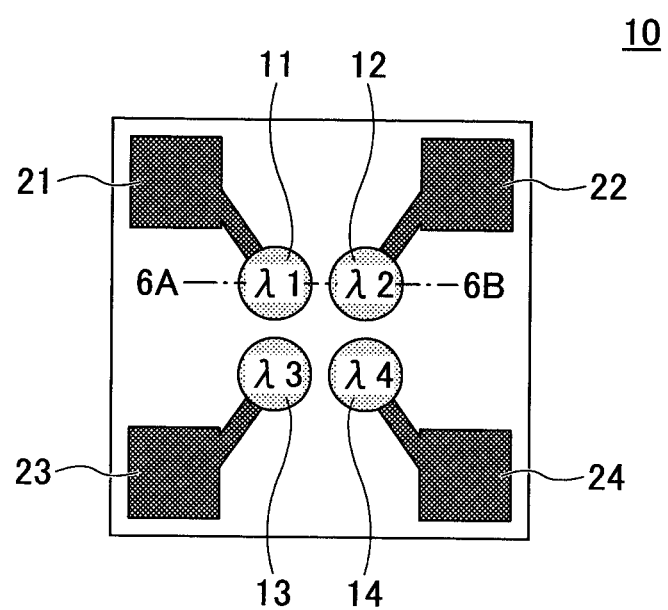
FIG. 6 is a plan view of a surface emitting laser element according to a second embodiment.
Figure 7:
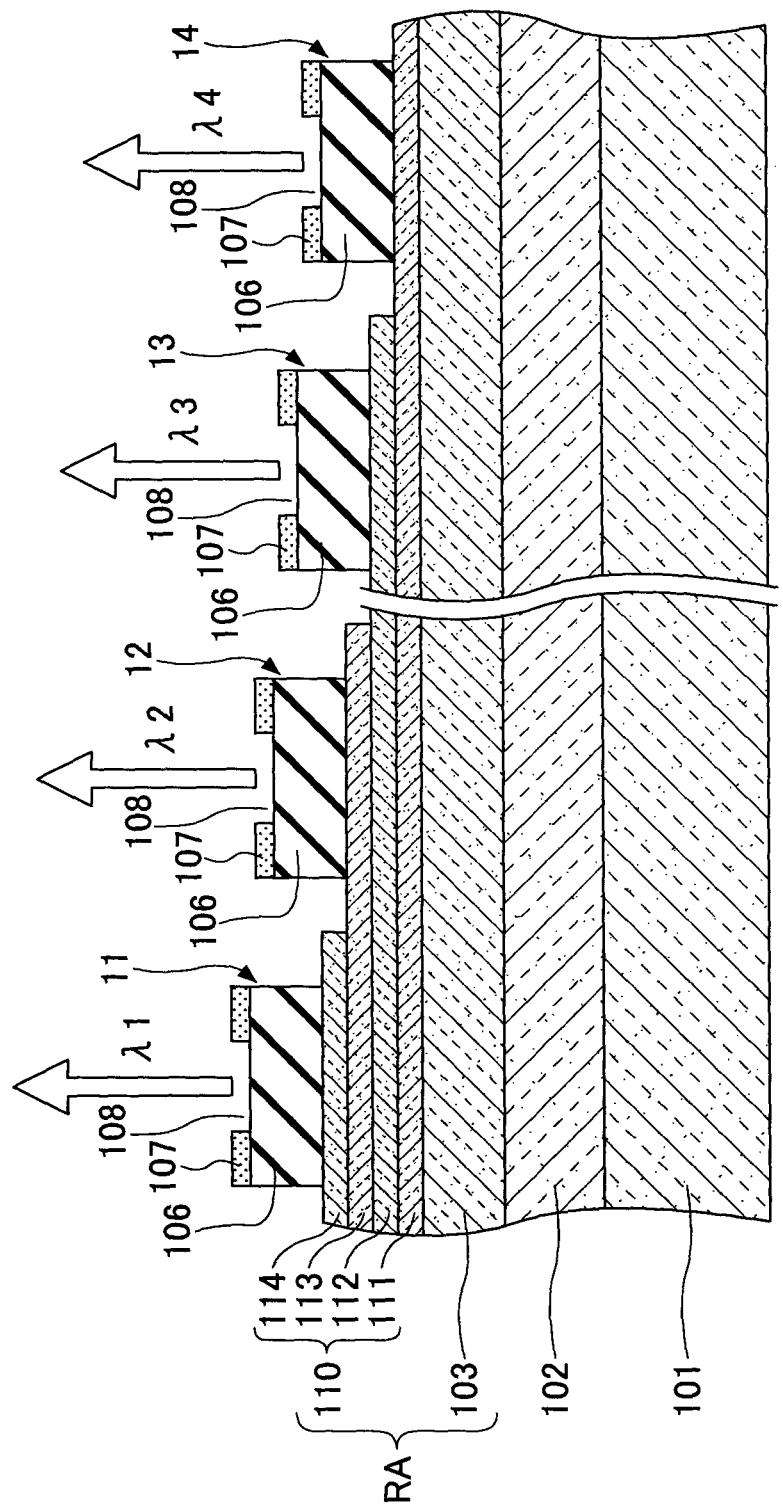
FIG. 7 illustrates the surface emitting laser element according to the second embodiment.

Next, a surface emitting laser element according to a second embodiment will be described. The surface emitting laser element 10 according to the second embodiment has plural vertical cavity surface emitting lasers, as shown in FIGS. 6 and 7. Specifically, the surface emitting laser element 10 according to the second embodiment includes a first vertical cavity surface emitting laser 11, a second vertical cavity surface emitting laser 12, a third vertical cavity surface emitting laser 13 and a fourth vertical cavity surface emitting laser 11. It is noted that FIG. 7 is simplified for the purpose of explanation of the second embodiment, and for the purpose of convenience, a contact layer, a selective oxidized area and so forth are omitted from FIG. 7.

The first vertical cavity surface emitting laser 11, the second vertical cavity surface emitting laser 12, the third vertical cavity surface emitting laser 13 and the fourth vertical cavity surface emitting laser 14 are connected with electrode pads that are provided to correspond to the vertical cavity surface emitting lasers 11, 12, 13, 14, respectively. Specifically, the first vertical cavity surface emitting laser 11 is connected with the electrode pad 21, the second vertical cavity surface emitting laser 12 is connected with the electrode pad 22, the third vertical cavity surface emitting laser 13 is connected with the electrode pad 23, and the fourth vertical cavity surface emitting laser 14 is connected with the electrode pad 24. Further, the first vertical cavity surface emitting laser 11, the second vertical cavity surface emitting laser 12, the third vertical cavity surface emitting laser 13 and the fourth vertical cavity surface emitting laser 14 emit light having mutually different wavelengths, respectively. That is, the wavelength λ1 of light emitted by the first vertical cavity surface emitting laser 11, the wavelength λ2 of light emitted by the second vertical cavity surface emitting laser 12, the wavelength λ3 of light emitted by the third vertical cavity surface emitting laser 13, and the wavelength λ4 of light emitted by the fourth vertical cavity surface emitting laser 14 are mutually different.

In order that the mutually different wavelengths λ1 through λ4 of light are thus to be emitted, different film thicknesses of a wavelength adjustment layer 110 are provided, which is formed between an active layer 103 and upper DBRs 106, for the first vertical cavity surface emitting laser 11 through the fourth vertical cavity surface emitting laser 14, respectively. That is, as shown in FIG. 7, in the surface emitting laser element according to the second embodiment, a lower DBR 102 is formed on a substrate 101, and the active layer 103, the wavelength adjustment layer 110 and the upper DBRs 106 are formed on the lower DBR 102. In this configuration, the wavelengths of light emitted by the respective vertical cavity surface emitting lasers 11 through 14 are determined by the thicknesses of a resonator area RA between the lower DBR 102 and the upper DBRs 106, respectively. Accordingly, in FIG. 7, since the resonator area RA is formed by the active layer 103 and the wavelength adjustment layer 110, it is possible to change the thickness of the resonator area RA for each of the vertical cavity surface emitting lasers 11 through 14 by providing the different thicknesses of the wavelength adjustment layer 110 for the respective vertical cavity surface emitting lasers 11 through 14. Thus, it is possible to cause the wavelengths of light emitted by the respective vertical cavity surface emitting lasers 11 through 14 to differ.

Specifically, on the substrate 101 made of a semiconductor or the like, the lower DBR 102 is formed by alternately laminating and forming semiconductor materials having different refractive indexes. On the lower DBR 102, the active layer 103 having a predetermined thickness is formed. On the active layer 103, the wavelength adjustment layer 110 having the different thicknesses for the respective vertical cavity surface emitting lasers 11 through 14 is formed. The wavelength adjustment layer 110 is formed as a result of, on the active layer 103, a first adjustment layer 111, a second adjustment layer 112, a third adjustment layer 113 and a fourth adjustment layer 114 being laminated in the stated order. The first adjustment layer 111 and the third adjustment layer 113 are formed of the same material. The second adjustment layer 112 and the fourth adjustment layer 114 are formed of the same material. Specifically, one of the varying two materials of the first adjustment layer 111 through the fourth adjustment layer 114 is GaInP, and the other material is GaAsP or GaAs. In other words, the first adjustment layer 111 and the third adjustment layer 113 may be made of GaInP and the second adjustment layer 112 and the fourth adjustment layer 114 may be made of GaAsP or GaAs. Alternatively, the first adjustment layer 111 and the third adjustment layer 113 may be made of GaAsP or GaAs and the second adjustment layer 112 and the fourth adjustment layer 114 may be made of GaInP. It is noted that the lower DBR 102, the active layer 103 and the wavelength adjustment layer 110 being semiconductor layers formed on the substrate 101 are formed by epitaxial growth.

On the wavelength adjustment layer 110, the upper DBRs 106 are formed for the respective vertical cavity surface emitting lasers 11 through 14. The upper DBRs 106 are dielectric films made of oxides, nitrides, fluorides and/or the like, and are formed as a result of a high refractive index film(s) and a low refractive index film(s) being alternately laminated and formed.

On the upper DBRs 106, the same as in the first embodiment, light shielding parts 107 having openings 108 at the centers are formed, respectively. The light shielding parts 107 are formed of metal materials, and, for example, are formed of laminated films of Cr (lower layer) and Au (upper layer), or the like. According to the second embodiment, light from the surface emitting laser element is emitted from the openings 108. It is noted that the reason for using Cr as the lower layer is to increase adhesive properties between the light shielding part 107 and the dielectric film included in the upper DBR 106. It is also possible to use Ti or the like instead of Cr. In the vertical cavity surface emitting lasers according to the second embodiment, only the light shielding parts 107 are formed, without upper electrodes 131 being formed, on the upper DBRs 106. Thus, by forming the light shielding parts 107 having the openings 108 on the upper DBRs 106, it is possible to increase the divergence angles of light emitted from the openings 108.

Thus, according to the second embodiment, the first adjustment layer 111, the second adjustment layer 112, the third adjustment layer 113 and the fourth adjustment layer 114 are formed in the wavelength adjustment layer 110 for the first vertical cavity surface emitting laser 11. Thus, the resonator area RA is formed by the first adjustment layer 111, the second adjustment layer 112, the third adjustment layer 113, the fourth adjustment layer 114, and the active layer 103. Thus, the first vertical cavity surface emitting laser 11 emits light of the wavelength of λ1 corresponding to the thickness of the resonator area RA in the first vertical cavity surface emitting laser 11.

For the second vertical cavity surface emitting laser 12, the first adjustment layer 111, the second adjustment layer 112 and the third adjustment layer 113 of the wavelength adjustment layer 110 are formed. Thus, the resonator area RA is formed by the first adjustment layer 111, the second adjustment layer 112, the third adjustment layer 113, and the active layer 103. Thus, the second vertical cavity surface emitting laser 12 emits light of the wavelength of λ2 corresponding to the thickness of the resonator area RA in the second vertical cavity surface emitting laser 12.

For the third vertical cavity surface emitting laser 13, the first adjustment layer 111 and the second adjustment layer 112 of the wavelength adjustment layer 110 are formed. Thus, the resonator area RA is formed by the first adjustment layer 111, the second adjustment layer 112, and the active layer 103. Thus, the third vertical cavity surface emitting laser 13 emits light of the wavelength of λ3 corresponding to the thickness of the resonator area RA in the third vertical cavity surface emitting laser 13.

For the fourth vertical cavity surface emitting laser 14, the first adjustment layer 111 of the wavelength adjustment layer 110 is formed. Thus, the resonator area RA is formed by the first adjustment layer 111 and the active layer 103. Thus, the fourth vertical cavity surface emitting laser 14 emits light of the wavelength of λ4 corresponding to the thickness of the resonator area RA in the fourth vertical cavity surface emitting laser 14.

Thus, in the surface emitting laser element according to the second embodiment, it is possible to form the plural vertical cavity surface emitting lasers 11 through 14 which emit light having the different wavelengths on the single substrate 101. Accordingly, even in a case where a variation in a film thickness occurs in a semiconductor layer or the like during manufacture of a surface emitting laser element, it is possible to easily obtain a semiconductor laser having a desired wavelength by selecting one that emits light of the wavelength that is closest to the desired wavelength from among the first vertical cavity surface emitting laser 11 through the fourth vertical cavity surface emitting laser 14. Thus, it is possible to manufacture a surface emitting laser element having a vertical cavity surface emitting laser that emits light of a predetermined wavelength at low cost. It is noted that the respective vertical cavity surface emitting lasers 11 through 14 in the surface emitting laser element according to the second embodiment have wide divergence angles, respectively. Thus, the second embodiment has advantageous effects the same as or similar to those of the first embodiment.

(Method of Forming Wavelength Adjustment Layer in Surface Emitting Laser Element)

Next, a method of forming the wavelength adjustment layer in the surface emitting laser element according to the second embodiment will be described.

First, as shown in FIG. 8A, on the substrate 101, the lower DBR 102, the active layer 103 and the wavelength adjustment layer 110 made of semiconductor materials are formed by epitaxial growth through MOCVD or MBE. It is noted that the wavelength adjustment layer 110 is formed as a result of the first adjustment layer 111, the second adjustment layer 112, the third adjustment layer 113 and the fourth adjustment layer 114 being laminated. The first adjustment layer 111 and the third adjustment layer 113 are formed of GaInP, and the second adjustment layer 112 and the fourth adjustment layer 114 are formed of GaAsP. Further, according to the second embodiment, the resonator area RA is formed in such a manner that the optical thickness of the resonator area RA is 3λ for the oscillation wavelength λ. In other words, in the first vertical cavity surface emitting laser 11, the optical thickness of the resonator area RA is 3λ1. In the second vertical cavity surface emitting laser 12, the optical thickness of the resonator area RA is 3λ2. In the third vertical cavity surface emitting laser 13, the optical thickness of the resonator area RA is 3λ3. In the fourth vertical cavity surface emitting laser 14, the optical thickness of the resonator area RA is 3λ4.

Figure 8B:
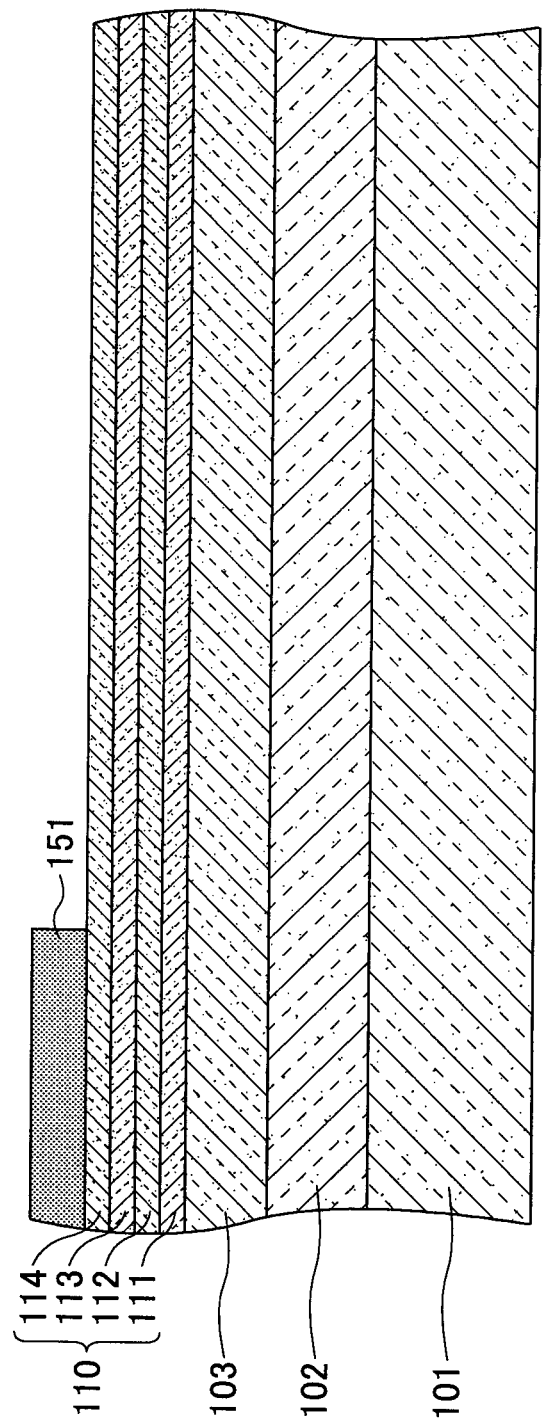

Next, as shown in FIG. 8B, a resist pattern 151 is formed at an area at which the first vertical cavity surface emitting laser 11 will be formed. Specifically, photoresist is coated on the fourth adjustment layer 114 of the wavelength adjustment layer 110, and exposure and development are carried out using an exposure apparatus. Thus, the resist pattern 151 is formed.

Figure 8C:
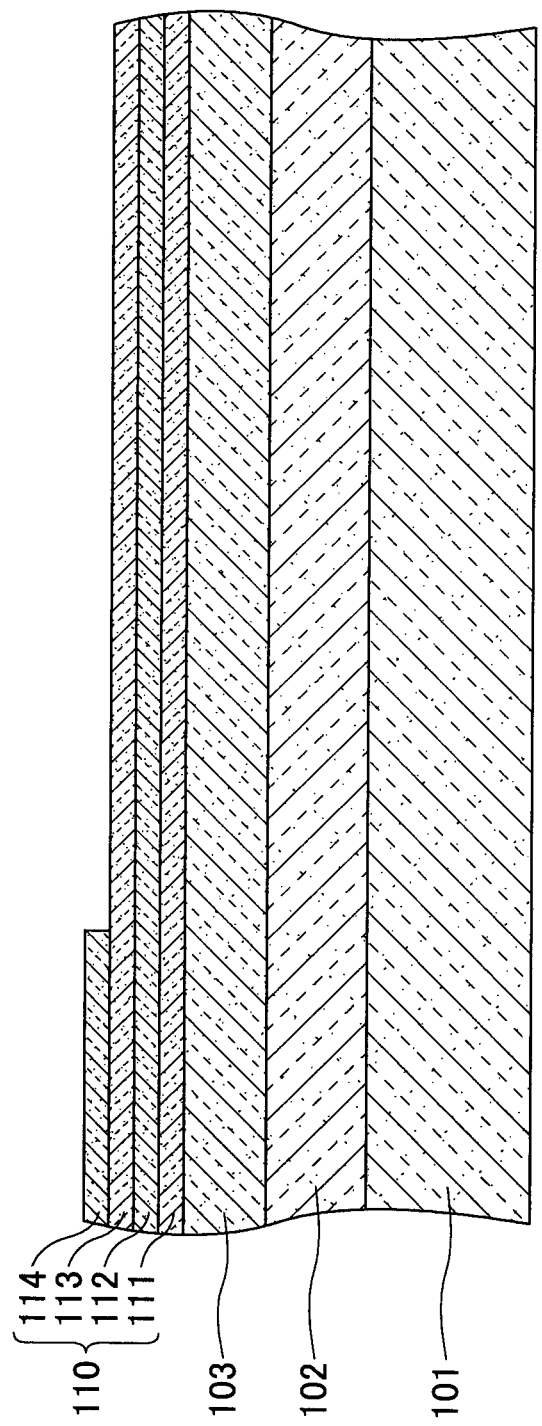

Next, as shown in FIG. 8C, the fourth adjustment layer 114 is removed by wet etching at the area at which the resist pattern 151 is not formed. Specifically, the fourth adjustment layer 114 is formed of GaAsP, and thus, wet etching is carried out using a mixed liquid of sulfuric acid, hydrogen peroxide and water. Thereby, only the fourth adjustment layer 114 at the area at which the resist pattern 151 is not formed is removed, and the surface of the third adjustment layer 113 is exposed. It is noted that the mixed liquid can be used for etching GaAsP, but is hardly effective for etching GaInP by which the third adjustment layer 113 is formed. The mixed liquid may be referred to as a "first etching liquid". Thereafter, the resist pattern 151 is removed using an organic solvent or the like.

Next, as shown in FIG. 9A, a resist pattern 152 is formed at an area at which the first vertical cavity surface emitting laser 11 and the second vertical cavity surface emitting laser 12 will be formed. Specifically, photoresist is coated on the fourth adjustment layer 114 and the third adjustment layer 113 of the wavelength adjustment layer 110, and exposure and development are carried out using the exposure apparatus. Thus, the resist pattern 152 is formed.

Next, as shown in FIG. 9B, the third adjustment layer 113 is removed by wet etching at the area at which the resist pattern 152 is not formed. Specifically, the third adjustment layer 113 is formed of GaInP, and thus, wet etching is carried out using a mixed liquid of hydrochloric acid and water. Thereby, only the third adjustment layer 113 at the area at which the resist pattern 152 is not formed is removed, and the surface of the second adjustment layer 112 is exposed. It is noted that the mixed liquid can be used for etching GaInP, but is hardly effective for etching GaAsP by which the second adjustment layer 112 is formed. The mixed liquid may be referred to as a "second etching liquid". Thereafter, the resist pattern 152 is removed using an organic solvent or the like.

Next, as shown in FIG. 9C, a resist pattern 153 is formed at an area at which the first vertical cavity surface emitting laser 11, the second vertical cavity surface emitting laser 12 and the third vertical cavity surface emitting laser 13 will be formed. Specifically, photoresist is coated on the fourth adjustment layer 114, the third adjustment layer 113 and the second adjustment layer 112 of the wavelength adjustment layer 110, and exposure and development are carried out using the exposure apparatus. Thus, the resist pattern 153 is formed.

Next, as shown in FIG. 10A, the second adjustment layer 112 is removed by wet etching at the area at which the resist pattern 153 is not formed. Specifically, the second adjustment layer 112 at the area at which the resist pattern 153 is not formed is removed using the first etching liquid. Thereby, only the second adjustment layer 112 at the area at which the resist pattern 153 is not formed is removed, and the surface of the first adjustment layer 111 is exposed. Thereafter, the resist pattern 153 is removed using an organic solvent or the like.

Next, as shown in FIG. 10B, the upper DBRs 106 are formed. Specifically, at the respective areas on the wavelength adjustment layer 110, dielectric films made of high refractive index materials made of oxides, nitrides, fluorides and/or the like and dielectric films made of low refractive index materials made of oxides, nitrides, fluorides and/or the like are laminated alternately for respective predetermined film thicknesses by sputtering or the like.

Thereby, it is possible to form the wavelength adjustment layer 110 and the upper DBRs 106 in the surface emitting laser element according to the second embodiment.

According to the second embodiment, different from Patent documents Nos. 3 and 7, Al is not included in the first adjustment layer 111, the second adjustment layer 112, the third adjustment layer 113 and the fourth adjustment layer 114 of the wavelength adjustment layer 110. As a result, oxidization or the like does not easily occur after etching, and it is possible to maintain a clean surface state even after etching. That is, Al may be very easily corroded, and thus, if any one of the first adjustment layer 111, the second adjustment layer 112, the third adjustment layer 113 and the fourth adjustment layer 114 were formed by a material including Al, the surface would have a degraded state after undergoing wet etching or the like. Then, even if the upper DBRs 106 were formed thereon, they would peel, the thickness of the resonator areas RA would become nonuniform, and/or the like. However, according to the second embodiment, since the wavelength adjustment layer 110 is formed by materials that do not include Al, corrosion of Al or the like does not occur, and such a problem does not occur.

Further, according to the second embodiment, the wavelength adjustment layer 110 is formed to have a structure in which GaAsP and GaInP are alternately formed. Then, when wet etching is carried out, the two types of etching liquids are used, each of which can be used to etch the respective one of GaAsP and GaInP but is hardly effective for etching the other thereof, and etching is carried out by using them alternately. By carrying out etching using such varying types of etching liquids, the surface after the etching is flat, the surface does not undergo over-etching, and thus, it is possible to form the wavelength adjustment layer 110 with the predetermined thicknesses. Thereby, it is possible to obtain a surface emitting laser element having stable characteristics.

It is noted that in a case where as discussed in Patent documents Nos. 3 and 7, an epiwafer is processed (a wavelength adjustment layer is processed), and then, an upper DBR is made to grow again, a deficiency may occur such as a problem in flatness on unevenness of etching on the grown layer, a problem in crystallinity or the like. In contrast, according to the second embodiment, even in a case where the wavelength adjustment layer is processed, such a deficiency does not occur because the upper DBR is formed by a dielectric(s).

(Surface Emitting Laser Element)

Figure 11:
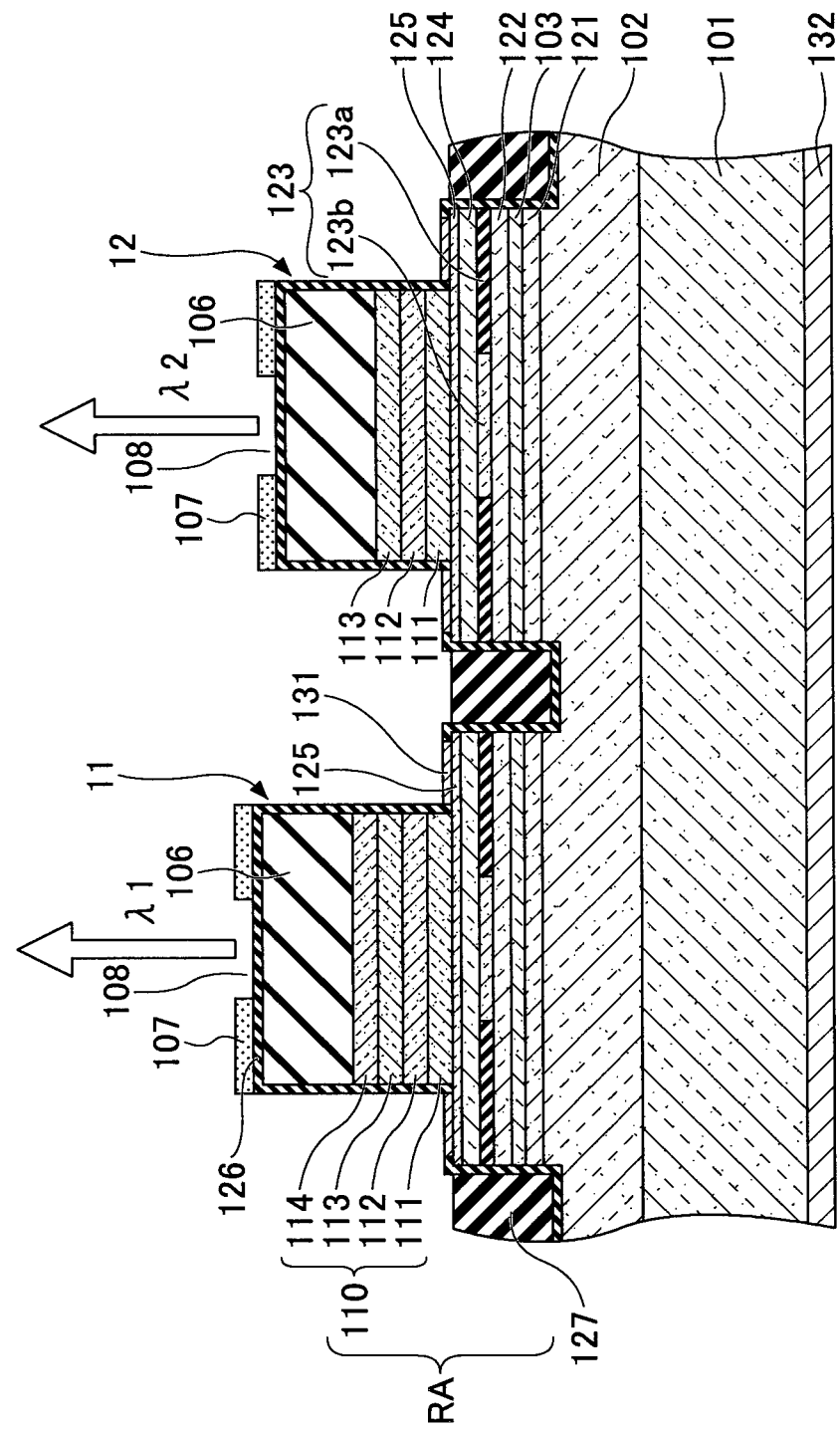
FIG. 11 shows a structure of the surface emitting laser element according to the second embodiment.

Next, based on FIG. 11, the surface emitting laser element according to the second embodiment will be described in more detail. FIG. 11 is a sectional view obtained from cutting along an alternate long and short dash line 6A-6B in FIG. 6. The surface emitting laser element of FIG. 11 has a configuration in which an AlAs layer that becomes the current confining layer is selectively oxidized and the current confining structure is formed. The surface emitting laser element is produced to have the oscillation wavelength of 894.6 nm. Specifically, the four vertical cavity surface emitting lasers are formed on a semiconductor chip (substrate) of a square shape having a size of 300 µm by 300 µm. Thus, in the surface emitting laser element, it is possible to form the plural vertical cavity surface emitting lasers within a narrow area. As a result, even when the vertical cavity surface emitting laser to emit light is switched among the plural vertical cavity surface emitting lasers, the light emitting position hardly changes. Accordingly, optical axis adjustment or the like is not necessary or can be very easily carried out. Thus, the size of the substrate is preferably less than or equal to 500 µm by 500 µm.

According to the second embodiment, as the substrate 101, an n-GaAs substrate is used. Further, the lower DBR 102 is formed as a result of 35.5 pairs each including an n-$Al_{0.1}Ga_{0.9}As$ high refractive index layer and an n-$Al_{0.9}Ga_{0.1}As$ low refractive index layer being laminated in such a manner that the optical film thickness of each layer is $\lambda/4$.

On the lower DBR 102, the active layer 103 made of GaInAs quantum well layer/GaInPAs barrier layer is formed via a lower spacer layer 121 made of $Al_{0.2}Ga_{0.8}As$. On the active layer 103, a first upper spacer layer 122 made of $Al_{0.2}Ga_{0.8}As$, a current confining layer 123 made of AlAs, a second upper spacer layer 124 made of $Al_{0.2}Ga_{0.8}As$ and a contact layer 125 made of p-GaAs are laminated and formed in sequence. It is noted that the contact layer 125 is the same or similar to the contact layer 105 in the first embodiment.

On the contact layer 125, the wavelength adjustment layer 110 made of the first adjustment layer 111, the second adjustment layer 112, the third adjustment layer 113 and the fourth adjustment layer 114 is formed as a result of GaAsP and GaInP being alternately laminated and formed. As described above, the parts of the wavelength adjustment layer 110 are removed at the predetermined areas corresponding to the respective vertical cavity surface emitting lasers. It is noted that the lower DBR 102, the lower spacer layer 121, the active layer 103, the first upper spacer layer 122, the current confining layer 123, the second upper spacer layer 124, the contact layer 125 and the wavelength adjustment layer 110 are formed by epitaxial growth by MOCVD or MBE.

In the surface emitting laser element according to the second embodiment, the respective vertical cavity surface emitting lasers have mesa structures, and the mesa structures are formed by etching semiconductor layers between the vertical cavity surface emitting lasers to be formed. After the mesa structures are formed, heat treatment is carried out with steam, and thereby, the current confining layers 123 not yet oxidized are oxidized from the outside around the mesa structures. Thus, selectively oxidized areas 123a (oxidized areas) in the periphery and current confining areas 123b not oxidized at the center are formed. That is, the current confining layers 123 include the selectively oxidized areas 123b oxidized and the current confining areas 123b not oxidized, and thus, have current confining structures, respectively. According to the second embodiment, the shapes of the mesa structures are, for example, circular shapes viewed from the top. However, instead, the mesa structures may also be formed such that the shapes of the mesa structures viewed from the top may be elliptic shapes, square shapes, rectangular shapes or the like.

On the wavelength adjustment layers 110 defined by the etching to correspond to the respective vertical cavity surface emitting lasers, the upper DBRs 106 are formed as a result of 8.5 pairs being laminated each including a $TiO_2$ high refractive index layer and a $SiO_2$ low refractive index layer in such a manner that the optical film thickness of each layer is $\lambda/4$. It is noted that the upper DBRs 106 are not limited to those mentioned above, as long as the upper DBRs 106 are those formed by alternately laminating a high refractive index material(s) and a low refractive index material(s), which materials are dielectric materials. As specific examples, oxides, nitrides, fluorides and so forth may be cited. As specific examples of the high refractive index material(s), $Ta_2O_5$, $HfO_2$ and so forth may be cited, other than $TiO_2$. As specific examples of the low refractive index material(s), $MgF_2$ and so forth may be cited, other than $SiO_2$.

It is noted that in the surface emitting laser element according to the second embodiment, the wavelength adjustment layer 110 and the upper DBR 106 are formed at the area smaller than the area at which the contact layer 125 is formed in each of the vertical cavity surface emitting lasers. That is, the wavelength adjustment layer 110 and the upper DBR 106 are formed in such a manner that a part of the surface of the contact layer 125 is exposed. Further, according to the second embodiment, the resonator area RA is formed by the active layer 103, the wavelength adjustment layer 110 and so forth formed between the lower DBR 102 and the upper DBR 106. Further, a DBR of several pairs of semiconductor layers that have different refractive indexes being laminated may be formed between the active layer 103 and the contact layer 125, whereby an effect of a wavelength adjustment layer can be obtained.

Thereafter, a protective film 126 made of SiN having an optical film thickness of $\lambda/4$ is entirely formed, the protective film 126 is removed on the contact layer 125 at areas at which upper electrodes 131 will be formed, and the upper electrodes 131 being p-side electrodes are formed. The upper electrodes 131 are formed to correspond to the respective vertical cavity surface emitting lasers and the respective upper electrodes 131 are connected with the respective electrode pads 21 through 24 shown in FIG. 6. Further, on the back side of the substrate 101, a lower electrode 132 being an n-side electrode is formed. The grooves between the mesa structures are filled with polyimide 127. It is noted that the structure of the lower electrode is not limited to the above-mentioned one formed on the back side of the substrate. For example, lower electrodes may be formed of an intracavity contact structure or the like, i.e., the lower electrodes may be connected with contact layers not shown) which may be formed between the lower DBR 102 and the active layers 103.

Further, on the upper DBRs 106, the light shielding parts 107 having the openings 108 at the centers are formed, respectively. The light shielding parts 107 are formed by metal materials, and, for example, are formed by laminated films of Cr (lower layer) and Au (upper layer), or the like. According to the second embodiment, light from the surface emitting laser element is emitted from the openings 108. It is noted that the reason for using Cr as the lower layer is to increase adhesive properties between the light shielding parts 107 and the dielectric films included in the upper DBRs 106, respectively. It is also possible to use Ti or the like instead of Cr. As a specific method of forming the light shielding parts 107, a lift-off method may be used to form them. Specifically, photoresist is coated on the upper DBRs 106, and exposure and development are carried out using an exposure apparatus. Thus, resist patterns having openings at areas at which the light shielding parts will be formed are formed. Then, after a Cr film and an Au film are formed by a vacuum evaporation method or the like, an organic solvent or the like is used for dipping the formed films therein. Thus, the Cr film and Au film are removed together with the resist patterns at the areas at which they are formed on the resist patterns.

It is noted that although the case has been described where the upper electrodes 131 being p-side electrodes and the light shielding parts 107 are formed separately, the upper electrodes 131 and the light shielding parts 107 may be formed simultaneously. In this case, the upper electrodes 131 and the light shielding parts 107 may be formed to be integrated, respectively. In the surface emitting laser element according to the second embodiment, on the upper DBRs 106, only the light shielding parts 107 are formed, and the upper electrodes 131 are not formed on the upper DBRs 106. By thus forming the light shielding parts 107 having the openings 108 on the upper DBRs 106, it is possible to increase the divergence angles of light emitted from the openings 108, respectively.

The surface emitting laser element according to the second embodiment emits laser light of the wavelengths of $\lambda 1$, $\lambda 2$ and so forth different for the respective vertical cavity surface emitting lasers in directions indicated by arrows in FIG. 11. Further, SiN being the protective film 126 has a function as an upper reflecting mirror, and also, a function of improving the reliability by covering the layers including Al that is exposed on the side walls when the mesa structures are formed.

In the surface emitting laser element according to the second embodiment, the upper DBRs 106 are formed as a result of the dielectric films having the different refractive indexes being laminated and formed. Thus, it is possible to increase the differences between the refractive indexes in comparison to a structure in which semiconductor materials having different refractive indexes are laminated and formed. Thus, it is possible to reduce the number of layers to be laminated in the upper DBRs 106. Further, it is possible to reduce the optical thicknesses of the upper DBRs 106.

Further, in the surface emitting laser element according to the second embodiment, the upper electrodes 131 are formed on the contact layers 125, in the respective vertical cavity surface emitting lasers, formed below the wavelength adjustment layers 110. Thus, without being affected by the thicknesses of the wavelength adjustment layers 110, it is possible to equally flow electric currents to the respective vertical cavity surface emitting lasers. That is, if upper electrodes were formed on wavelength adjustment layers and were directly in contact with the wavelength adjustment layers, the material in contact with the upper electrode would differ depending on each of the vertical cavity surface emitting lasers. As a result, the resistances at the contact points would differ, or the electric current amounts that can be made to flow to the respective vertical cavity surface emitting lasers or the like would vary depending on the thicknesses of the wavelength adjustment layers. In such cases, the electric characteristics and light emitting characteristics would remarkably differ for the respective vertical cavity surface emitting lasers. Further, if contact layers were formed on wavelength adjustment layers and upper electrodes were formed thereon, the electric resistances would be increased due to band discontinuity on the interfaces between the respective layers included in the wavelength adjustment layers. Furthermore, since the numbers of the interfaces differ for the respective vertical cavity surface emitting lasers, the resistance values would differ for the respective vertical cavity surface emitting lasers. In contrast thereto, in the surface emitting laser element according to the second embodiment, the upper electrodes 131 are connected with the contact layers 125 that are formed below the wavelength adjustment layers 110. Thus, the upper electrodes 131 are formed at the same position in the respective vertical cavity surface emitting lasers without depending on the thicknesses of the wavelength adjustment layers 110. Accordingly, it is possible to make the electric characteristics of the respective vertical cavity surface emitting lasers approximately uniform, and thus, the characteristics do not remarkably differ depending on the wavelengths of light to be emitted.

The contents other than the above-mentioned are the same as or similar to those of the first embodiment.

Third Embodiment

Next, a third embodiment will be described. According to the third embodiment, different from the second embodiment, light shielding parts are provided below DBRs that are made of dielectric materials. A surface emitting laser element according to the third embodiment will now be described based on FIG. 12.

Figure 12:
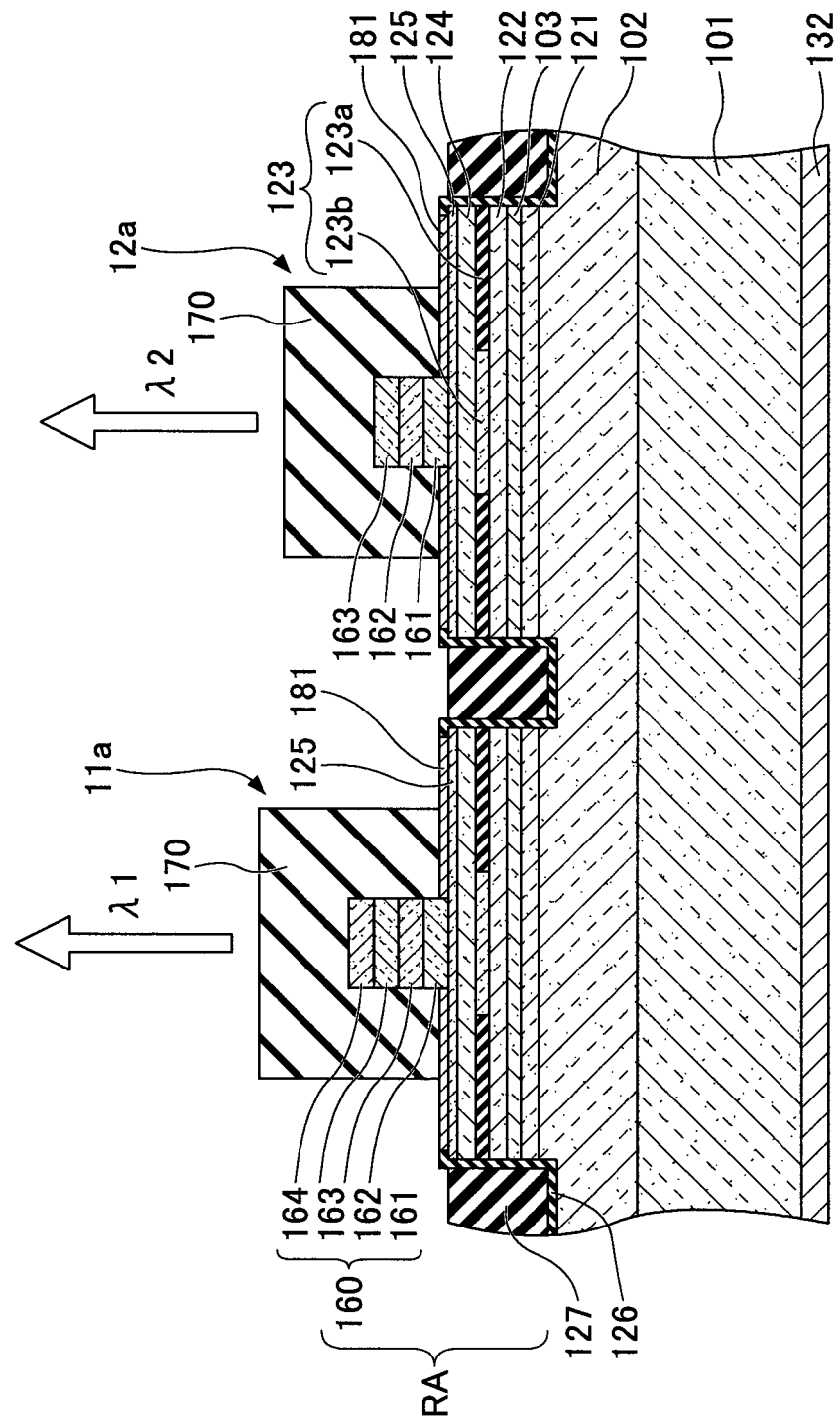
FIG. 12 shows a structure of a surface emitting laser element according to a third embodiment.

FIG. 12 is a sectional view obtained from cutting along a line corresponding to the alternate long and short dash line 6A-6B in FIG. 6. In the surface emitting laser element according to the third embodiment, a current confining structure is formed as a result of AlAs layers to be current confining layers 123 being selectively oxidized. The surface emitting laser element according to the third embodiment has an oscillation wavelength of 994.6 nm.

Specifically, four vertical cavity surface emitting lasers 11a, 12a, and so forth are formed on a semiconductor chip (substrate) of a square shape having a size of 300 µm by 300 µm. Thus, in the surface emitting laser element according to the third embodiment, it is possible to form the plural vertical cavity surface emitting lasers within a narrow area. As a result, even when the vertical cavity surface emitting laser to emit light is switched among the plural vertical cavity surface emitting lasers, the light emitting position hardly changes. Accordingly, optical axis adjustment or the like is not necessary or can be very easily carried out. Thus, the size of the substrate is preferably less than or equal to 500 µm by 500 µm.

According to the third embodiment, as the substrate 101, an n-GaAs substrate used. Further, a lower DBR 102 is formed as a result of 35.5 pairs each including an n-$Al_{0.1}Ga_{0.9}As$ high refractive index layer and an n-$Al_{0.9}Ga_{0.1}As$ low refractive index layer being laminated in such a manner that the optical film thickness of each layer is $\lambda/4$.

On the lower DBR 102, an active layer 103 made of GaInAs quantum well layer/GaInPAs barrier layer is formed via a lower spacer layer 121 made of $Al_{0.2}Ga_{0.8}As$. On the active layer 103, a first upper spacer layer 122 made of $Al_{0.2}Ga_{0.8}As$, a current confining layer 123 made of AlAs, a second upper spacer layer 124 made of $Al_{0.2}Ga_{0.8}As$ and a contact layer 125 made of p-GaAs are laminated and formed in sequence.

On the contact layer 125, a wavelength adjustment layer 160 made of a first adjustment layer 161, a second adjustment layer 162, a third adjustment layer 163 and a fourth adjustment layer 164 is formed as a result of GaAsP and GaInP being alternately laminated and formed. As described above for the wavelength adjustment layer 110 of the second embodiment, the parts of the wavelength adjustment layer 160 are removed at the predetermined areas corresponding to the respective vertical cavity surface emitting lasers 11a, 12a and so forth. It is noted that the lower DBR 102, the lower spacer layer 121, the active layer 103, the first upper spacer layer 122, the current confining layer 123, the second upper spacer layer 124, the contact layer 125 and the wavelength adjustment layer 16C are formed by epitaxial growth by MOCVD or MBE.

In the surface emitting laser element according to the third embodiment, the respective vertical cavity surface emitting lasers 11a, 12a and so forth have mesa structures, and the mesa structures are formed by etching semiconductor layers between the vertical cavity surface emitting lasers to be formed. After the mesa structures are formed, heat treatment is carried out with steam, and thereby, the current confining layers 123 not yet oxidized are oxidized from the outside around the mesa structures. Thus, selectively oxidized areas 123a (oxidized areas) in the periphery and current confining areas 123b not oxidized at the center are formed. That is, in the current confining layers 123, current confining structures are formed by the selectively oxidized areas 123b oxidized and the current confining areas 123b not oxidized, respectively. According to the third embodiment, the shapes of the mesa structures may be, for example, circular shapes viewed from the top. However, the mesa structures may also be formed such that the shapes of the mesa structures viewed from the top may be elliptic shapes, square shapes, rectangular shapes or the like.

Further, a protective film 126 made by SiN is formed on the entirety of the semiconductor layers. However, on the contact layers 125, the protective film 126 is removed at areas at which the wavelength adjustment layers 160 and upper electrodes 181 will be formed.

Thereafter, the upper electrodes 181 being p-side electrodes are formed. The upper electrodes 181 are formed to correspond to the respective vertical cavity surface emitting lasers, and are connected with electrode pads, respectively. As materials to form the upper electrodes 181, metal films in which Ti/Pt/Au, Cr/AuZn/Au or the like are laminated may be used. Specifically, it is possible to form the upper electrodes 181 through a lift-off method in which after resist patterns are formed, the above-mentioned laminated metal film is formed, and after that, an organic solvent of the like is used for dipping the formed film therein, whereby the metal film is removed at areas at which it is formed on the resist patterns. It is noted that the upper electrodes 181 have light shielding functions, and thus, also act as light shielding parts.

On the wavelength adjustment layers 160 defined by etching to correspond to the respective vertical cavity surface emitting lasers 11a, 12a and so forth, upper DBRs 170 are formed as a result of 8.5 pairs being laminated each including a $TiO_2$ high refractive index layer and a $SiO_2$ low refractive index layer in such a manner that the optical film thickness of each layer is $\lambda/4$. It is noted that the upper DBRs 170 are not limited those mentioned above as long as the upper DBRs 170 are formed by alternately laminating a high refractive index material(s) and a low refractive index material(s), which materials are dielectric materials. As specific examples, oxides, nitrides, fluorides and so forth may be cited. As specific examples of the high refractive index material(s), $Ta_2O_5$, $HfO_2$ and so forth may be cited, other than $TiO_2$. As specific examples of the low refractive index material(s), $MgF_2$ and so forth may be cited, other than $SiO_2$. At this time, the upper DBRs 170 may also be formed at parts of the upper electrodes 181 also acting as light shielding parts, as shown in FIG. 12.

In the surface emitting laser element according to the third embodiment, the wavelength adjustment layer 160 is formed at an area narrower than an area at which the contact layer 125 is formed in each of the vertical cavity surface emitting lasers. That is, the wavelength adjustment layer 160 is formed in such a manner that a part of the surface of the contact layer 125 is exposed. The upper electrode 181 is formed on the contact layer 125 at an area at which the wavelength adjustment layer 160 is not formed. Further, according to the third embodiment, a resonator area RA is formed by the active layer 103, the wavelength adjustment layer 160 and so forth formed between the lower DBR 102 and the upper DBR 170. Further, a DBR of several pairs of semiconductor layers that have different refractive indexes being laminated may be formed between the active layer 103 and the contact layer 125, and the effect of the wavelength adjustment layer 160 can also be obtained in this case.

Further, on the back side of the substrate 101, a lower electrode 132 being an n-side electrode is formed. The grooves between the mesa structures are filled with polyimide 127. It is noted that according to the third embodiment, the structure of the lower electrode is not limited to the lower electrode 132 mentioned above formed on the back side of the substrate 101. For example, lower electrodes 132 may also be of an intracavity contact structure or the like, i.e., the lower electrodes 132 may be connected with contact layers (not shown) which may be formed between the lower DBR 102 and the active layers 103.

The surface emitting laser element according to the third embodiment emits laser light of the wavelengths of $\lambda 1$, $\lambda 2$ and so forth different for the respective vertical cavity surface emitting lasers 11a, 12a and so forth in directions indicated by arrows in FIG. 12. Further, SiN being the protective film 126 has a function of improving the reliability by covering the layers that including Al that is exposed on the side walls when the mesa structures are formed.

Figure 13:
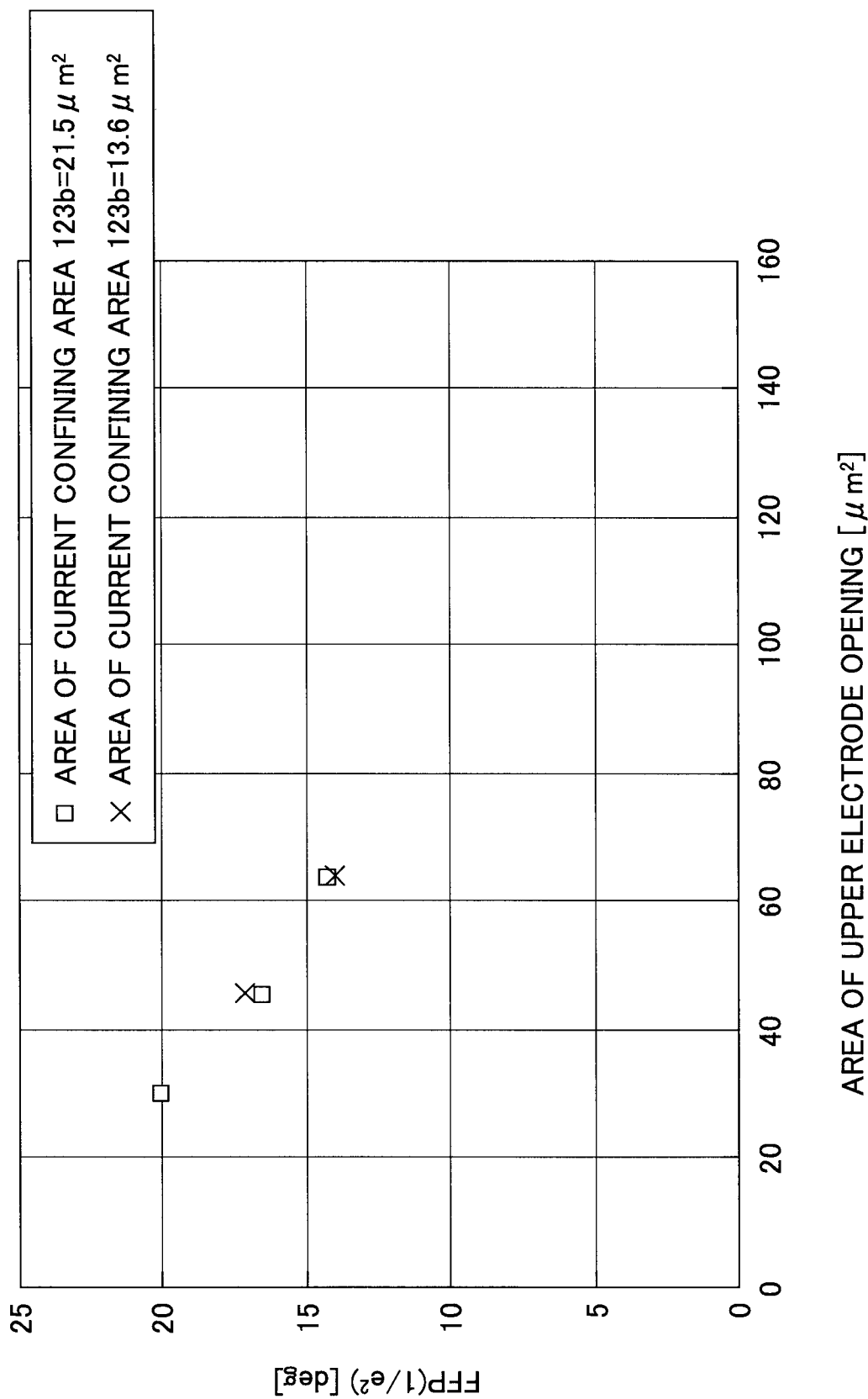
FIG. 13 is a correlation diagram between an area of an upper electrode opening and FFP of the surface emitting laser element according to the third embodiment.

In the surface emitting laser element according to the third embodiment, it is possible to increase the divergence angles of light to be emitted thereby, by the upper electrodes 181 also acting as light shielding parts. FIG. 13 shows the upper electrode opening area dependence of the divergence angle (angle at which intensity of emitted light is greater than or equal to $1/e^2$). Therefrom, it can be seen that when the area of the upper electrode opening is smaller than 30 $\mu m^2$, the divergence angle is greater than 20 degrees. It is noted that the upper electrode opening means the opening formed in the inside of the upper electrode 181.

The upper DBRs 170 are formed as a result of dielectric films having different refractive indexes being laminated and formed. Thus, it is possible to increase the differences between the refractive indexes in comparison to a structure in which semiconductor materials having different refractive indexes are laminated and formed. Thus, it is possible to reduce the number of layers to be laminated in the upper DBRs 170. Further, it is possible to reduce the thicknesses of the upper DBRs 170.

Further, in the surface emitting laser element according to the third embodiment, the upper electrodes 181 and the wavelength adjustment layers 160 are formed on the contact layers 125, respectively. Accordingly, without being affected by the thicknesses of the wavelength adjustment layers 160, it is possible to equally flow electric currents to the respective vertical cavity surface emitting lasers. That is, if upper electrodes were formed on wavelength adjustment layers and were directly in contact with the wavelength adjustment layers, the material in contact with the upper electrode would differ depending on each of the vertical cavity surface emitting lasers. As a result, the resistances at the contact points would differ, or the electric current amounts that can be made to flow to the respective vertical cavity surface emitting lasers or the like would vary depending on the thicknesses of the wavelength adjustment layers. In such cases, the electric characteristics and light emitting characteristics would remarkably differ for the respective vertical cavity surface emitting lasers. Further, if contact layers were formed on wavelength adjustment layers and upper electrodes were formed thereon, the electric resistances would be increased due to band discontinuity on the interfaces between the respective layers included in the wavelength adjustment layers. Furthermore, since the numbers of the interfaces differ for the respective vertical cavity surface emitting lasers, the resistance values would differ for the respective vertical cavity surface emitting lasers. However, in the surface emitting laser element according to the third embodiment, since the upper electrodes 181 are connected with the contact layers 125 formed below the wavelength adjustment layers 160, respectively, these possible problems can be avoided. It is noted that according to the third embodiment, the upper DBRs include dielectrics and the light shielding parts are provided between the semiconductors and the dielectrics, respectively. Thus, the configuration according to the third embodiment is different from the configuration of Patent document No. 6 in which the entirety of an upper DBR is formed of semiconductors.

Fourth Embodiment

Figure 14:
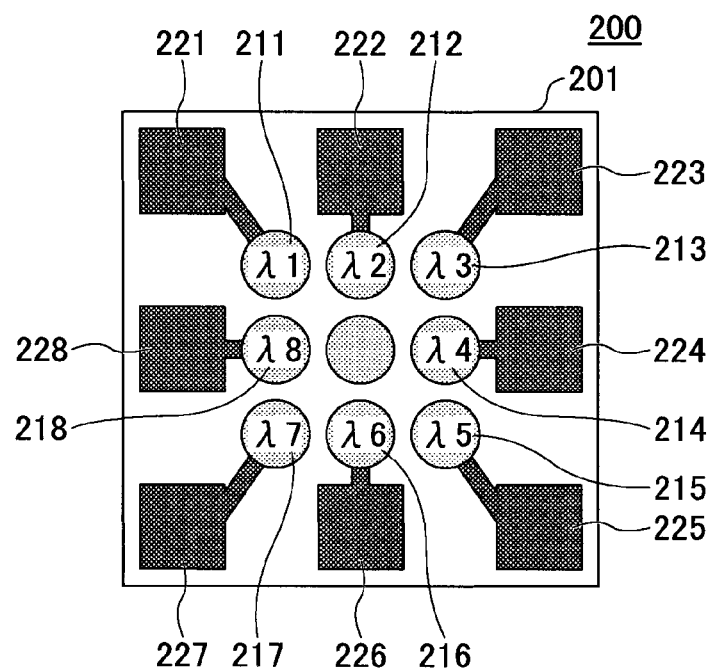
FIG. 14 is a plan view of a surface emitting laser element according to a fourth embodiment.

Next, a fourth embodiment will be described. Based on FIG. 14, a surface emitting laser element according to the fourth embodiment will be described. The surface emitting laser element 200 according to the fourth embodiment has eight vertical cavity surface emitting lasers on a substrate 201, and the eight vertical cavity surface emitting lasers emit light of different wavelengths, respectively.

Specifically, the surface emitting laser element 200 according to the fourth embodiment has a first vertical cavity surface emitting laser 211, a second vertical cavity surface emitting laser 212, a third vertical cavity surface emitting laser 213, a fourth vertical cavity surface emitting laser 214, a fifth vertical cavity surface emitting laser 215, a sixth vertical cavity surface emitting laser 216, a seventh vertical cavity surface emitting laser 217 and an eighth vertical cavity surface emitting laser 218 on the substrate 201. The first vertical cavity surface emitting laser 211 through the eighth vertical cavity surface emitting laser 218 are connected with respective electrode pads. Specifically, the first vertical cavity surface emitting laser 211 is connected with an electrode pad 221, the second vertical cavity surface emitting laser 212 is connected with an electrode pad 222, the third vertical cavity surface emitting laser 213 is connected with an electrode pad 223, the fourth vertical cavity surface emitting laser 214 is connected with an electrode pad 224, the fifth vertical cavity surface emitting laser 215 is connected with an electrode pad 225, the sixth vertical cavity surface emitting laser 216 is connected with an electrode pad 226, the seventh vertical cavity surface emitting laser 217 is connected with an electrode pad 227 and the eighth vertical cavity surface emitting laser 218 is connected with an electrode pad 228.

Further, the first vertical cavity surface emitting laser 211 through the eighth vertical cavity surface emitting laser 218 have mutually different wavelengths. That is, a wavelength $\lambda 1$ emitted by the first vertical cavity surface emitting laser 211, a wavelength $\lambda 2$ emitted by the second vertical cavity surface emitting laser 212, a wavelength $\lambda 3$ emitted by the third vertical cavity surface emitting laser 213, a wavelength $\lambda 4$ emitted by the fourth vertical cavity surface emitting laser 214, a wavelength $\lambda 5$ emitted by the fifth vertical cavity surface emitting laser 215, a wavelength 216 emitted by the sixth vertical cavity surface emitting laser 216, a wavelength $\lambda 7$ emitted by the seventh vertical cavity surface emitting laser 217 and a wavelength $\lambda 8$ emitted by the eighth vertical cavity surface emitting laser 218 are mutually different. In order that the respective vertical cavity surface emitting lasers emit light of the different wavelengths, a wavelength adjustment layer is provided as in the second embodiment, and the wavelength adjustment layer is formed in such a manner that the thickness of the wavelength adjustment layer varies for the respective vertical cavity surface emitting lasers. For this purpose, the number of layers included in the wavelength adjustment layer is increased. It is noted that the electrode pads 221 through 228 have approximately square shapes and the sizes thereof are approximately 50 μm by 50 μm each. The substrate 201 is a semiconductor chip having a square shape and the size thereof is 300 μm by 300 μm.

In the surface emitting laser element according to the fourth embodiment, since it is possible to select from the more wavelengths, it is possible to further improve the yield. Further, in the surface emitting laser element according to the fourth embodiment, not only the vertical cavity surface emitting laser having the wavelength closest to the required wavelength, but also the vertical cavity surface emitting laser having the wavelength second closest to the required wavelength may be used. By using it as a spare one, it is possible to effectively elongate the life of the surface emitting laser element.

The contents other than the above-mentioned are the same as or similar to those of the second embodiment.

Fifth Embodiment

Figure 15:
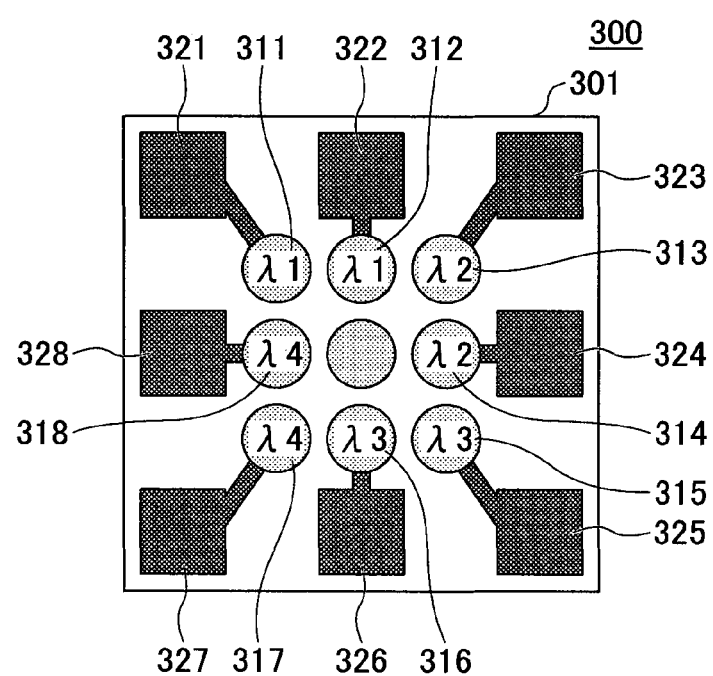
FIG. 15 is a plan view of a surface emitting laser element according to a fifth embodiment.

Next, a fifth embodiment will be described. Based on FIG. 15, a surface emitting laser element according to the fifth embodiment will be described. The surface emitting laser element 300 according to the fifth embodiment has eight vertical cavity surface emitting lasers on a substrate 301, and each pair of vertical cavity surface emitting lasers thereof emit light of the same wavelength.

Specifically, the surface emitting laser element 300 according to the fifth embodiment has a first vertical cavity surface emitting laser 311, a second vertical cavity surface emitting laser 312, a third vertical cavity surface emitting laser 313, a fourth vertical cavity surface emitting laser 314, a fifth vertical cavity surface emitting laser 315, a sixth vertical cavity surface emitting laser 316, a seventh vertical cavity surface emitting laser 317 and an eighth vertical cavity surface emitting laser 318 on the substrate 301. The first vertical cavity surface emitting laser 311 through the eighth vertical cavity surface emitting laser 318 are connected with respective electrode pads. Specifically, the first vertical cavity surface emitting laser 311 is connected with an electrode pad 321, the second vertical cavity surface emitting laser 312 is connected with an electrode pad 322, the third vertical cavity surface emitting laser 313 is connected with an electrode pad 323, the fourth vertical cavity surface emitting laser 314 is connected with an electrode pad 324, the fifth vertical cavity surface emitting laser 315 is connected with an electrode pad 325, the sixth vertical cavity surface emitting laser 316 is connected with an electrode pad 326, the seventh vertical cavity surface emitting laser 317 is connected with an electrode pad 327 and the eighth vertical cavity surface emitting laser 318 is connected with an electrode pad 328.

Further, the first vertical cavity surface emitting laser 311 through the eighth vertical cavity surface emitting laser 318 are formed in such a manner that each pair thereof have the same wavelength. Specifically, light emitted by the first vertical cavity surface emitting laser 311 and light emitted by the second vertical cavity surface emitting laser 312 have the same wavelength λ1. Light emitted by the third vertical cavity surface emitting laser 313 and light emitted by the fourth vertical cavity surface emitting laser 314 have the same wavelength λ2. Light emitted by the fifth vertical cavity surface emitting laser 315 and light emitted by the sixth vertical cavity surface emitting laser 316 have the same wavelength λ3. Light emitted by the seventh vertical cavity surface emitting laser 317 and light emitted by the eighth vertical cavity surface emitting laser 318 have the same wavelength λ4. The wavelength λ1 through the wavelength λ4 are mutually different. In order that the respective vertical cavity surface emitting lasers thus emit light of the wavelengths that are different for each pair thereof, a wavelength adjustment layer is provided as in the second embodiment, and the thickness of the wavelength adjustment layer varies for each pair of the vertical cavity surface emitting lasers. It is noted that the electrode pads 321 through 328 have approximately square shapes and the sizes thereof are approximately 50 μm by 50 μm each. The substrate 301 is a semiconductor chip having a square shape and the size thereof is 300 μm by 300 μm.

In the surface emitting laser element according to the fifth embodiment, each pair of the vertical cavity surface emitting lasers emit light of the same wavelength. Accordingly, even when one of the pair of the vertical cavity surface emitting lasers that emit light of the same wavelength becomes unable to emit light due to a bad quality or a trouble/fault, the other thereof can be used. Thus, it is possible to elongate the life of the surface emitting laser element, and also, to improve the yield. Further, in the surface emitting laser element according to the fifth embodiment, not only the vertical cavity surface emitting laser having the wavelength closest to the required wavelength, but also the vertical cavity surface emitting laser having the wavelength second closest to the required wavelength may be used, By using it as a spare one, it is possible to effectively elongate the life of the surface emitting laser element.

The contents other than the above-mentioned are the same as or similar to those of the second embodiment.

Sixth Embodiment

Next, a sixth embodiment will be described. An atomic oscillator according to the sixth embodiment uses the surface emitting laser element according to any one of the first through fifth embodiments. Based on FIG. 16, the atomic oscillator according to the sixth embodiment will be described. The atomic oscillator according to the sixth embodiment is a miniature atomic oscillator of a CPT system, and has a light source 410, a collimator lens 420, a λ/4 plate 430, an alkali metal cell 440, a light detector 450 and a modulator 460.

As the light source 410, the surface emitting laser element according to any one of the first through fifth embodiments is used. In the alkali metal cell 440, a Cs (cesium) atomic gas is sealed as an alkali metal, and transition of the D1 line is used. As the light detector 450, a photodiode is used.

In the atomic oscillator according to the sixth embodiment, light emitted by the light source 410 irradiates the alkali metal cell 440 in which the cesium atomic gas is sealed, and electrons in the cesium atoms are excited. The light having passed through the alkali metal cell 440 is detected by the light detector 450. A signal thus detected by the light detector 450 is fed back to the modulator 460, which modulates the surface emitting laser element in the light source 410.

It is noted that the surface emitting laser elements according to the first through fifth embodiments emit light having a wide divergence angle, for example, greater than or equal to 20°, or greater than or equal to 30°. Accordingly, it is possible to reduce the distance Xa between the light source 410 and the collimator lens 420. Thus, it is possible to further miniaturize the atomic oscillator.

Figure 16:
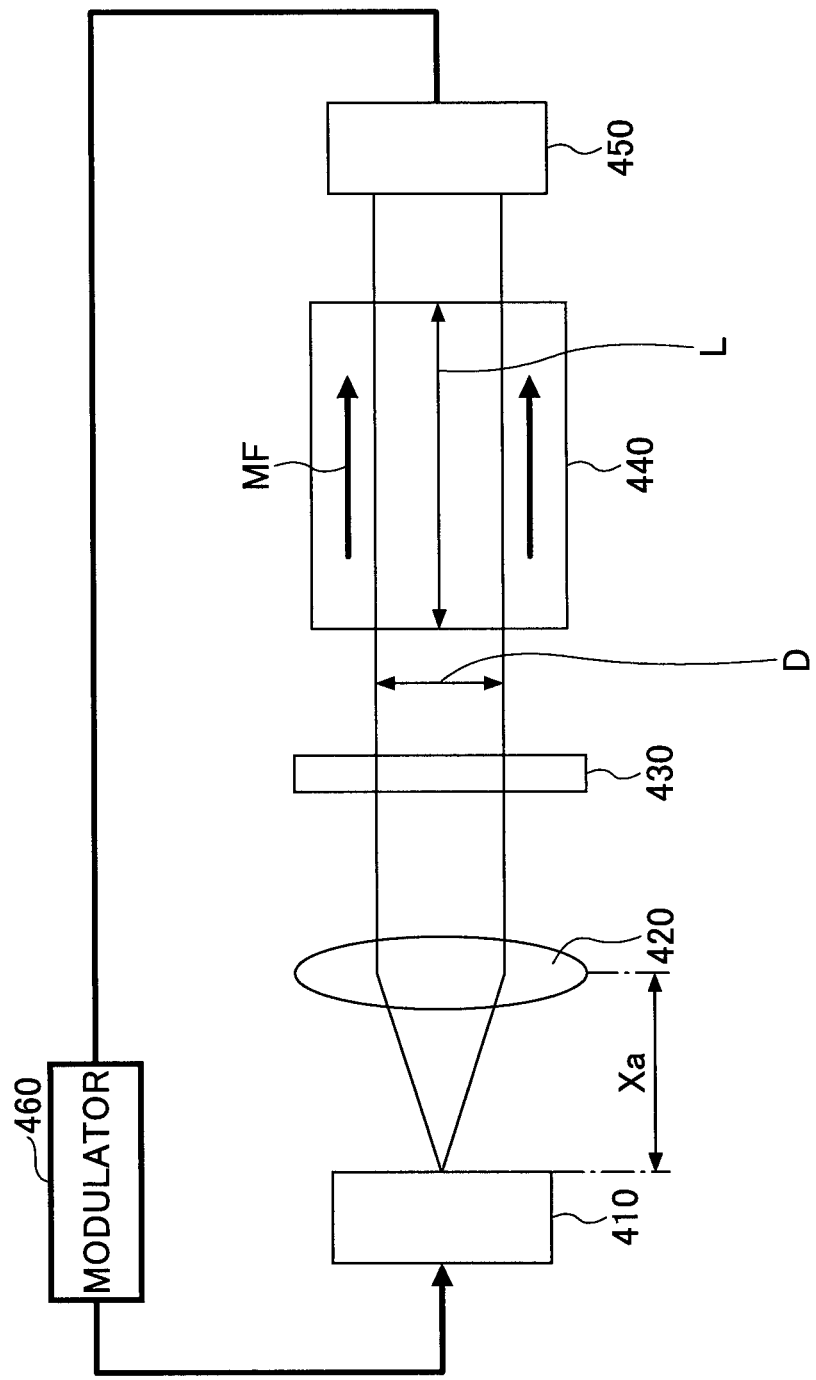
FIG. 16 illustrates an atomic oscillator according to a sixth embodiment.

In FIG. 16, Mt denotes a magnetic field; L denotes the optical path length of laser light passing through the alkali metal; D denotes a diameter of the laser light; and Xa denotes a distance.

Figure 17:
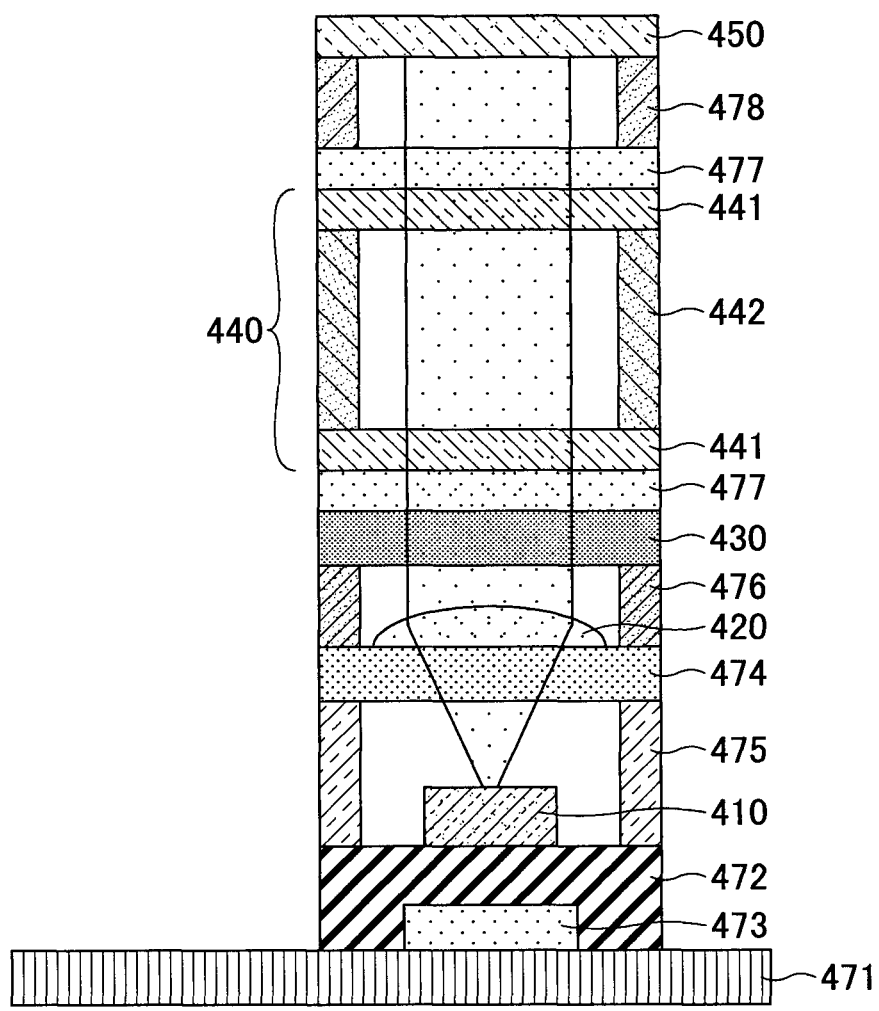
FIG. 17 shows a structure of the atomic oscillator according to the sixth embodiment.

Based on FIG. 17, the atomic oscillator according to the sixth embodiment will be described more specifically. The atomic oscillator according to the sixth embodiment is formed on a circuit substrate 471 vertically. On the circuit substrate 471, an alumina substrate 472 is provided. On the alumina substrate 472, the surface emitting laser element according to any one of the first through fifth embodiments is installed to be used as the light source 410. The alumina substrate 472 is provided with a surface emitting laser heater 473 for controlling the temperature the like of the light source 410. Above the light source 410, a Neutral Density (ND) filter 474 is provided. The ND filter 474 is installed at a predetermined position using a heat insulation spacer 475 made of glass or the like. Above the ND filter 474, the collimator lens 420 is provided, and above the collimator lens 420, the λ/4 plate 430 is provided. The λ/4 plate 430 is installed at a predetermined position using a spacer 476 made of silicon or the like. The alkali metal cell 440 is provided above the λ/4 plate 430. The alkali metal cell 440 has two glass substrates 441, and edge parts of the glass substrates 441 are connected by silicon substrates 442 in a state in which the glass substrates 441 face one another. The alkali metal is sealed in an area enclosed by the glass substrates 441 and the silicon substrates 442. It is noted that sides of the alkali metal cell 440 through which laser light passes are formed by the glass substrates 441. On both sides of the alkali metal cell 440, cell heaters 477 are provided, and thereby, it is possible to set the alkali metal cell 440 to a predetermined temperature. The light detector 450 is installed above the alkali metal cell 440, and is installed at a predetermined position using a spacer 478 made of silicon.

Figure 18:
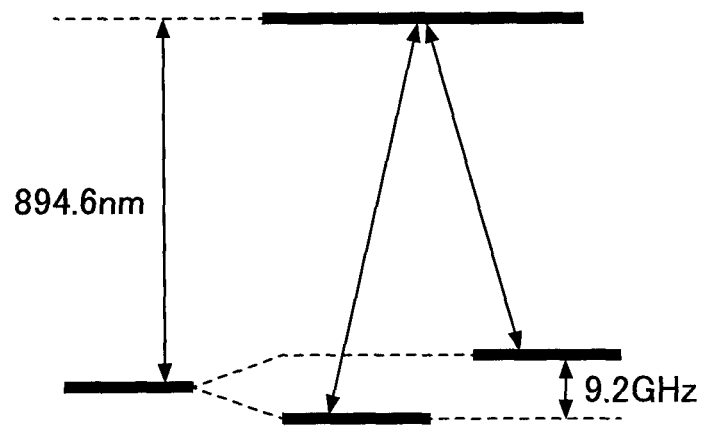
FIG. 18 illustrates atomic energy levels for illustrating a CPT system.
Figure 19:
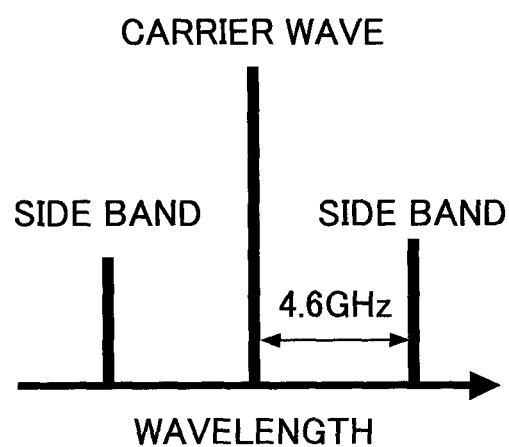
FIG. 19 illustrates an output wavelength at a time of modulating a vertical cavity surface emitting laser.
Figure 20:
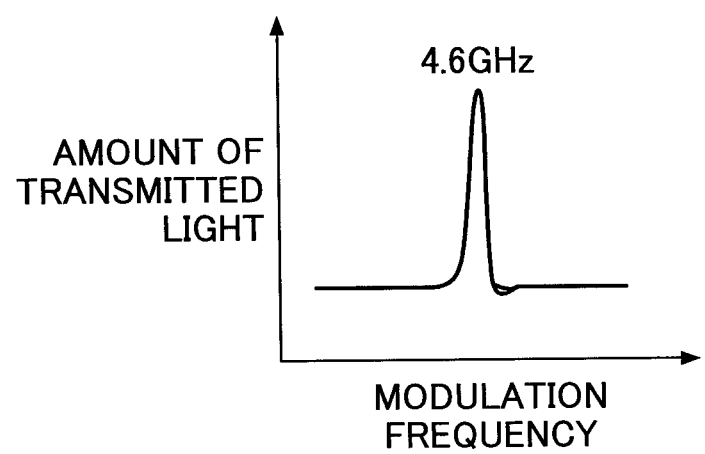
FIG. 20 is a correlation diagram between a modulation frequency and an amount of transmitted light.

Next, FIG. 18 shows a structure of atomic energy levels associated with CPT. Reduction of absorptivity of light is used which occurs when electrons are simultaneously excited to an excitation level from two ground levels. A vertical cavity surface emitting laser having a wavelength of a carrier wave close to 894.6 nm is used. The wavelength of the carrier wave can be tuned as a result of the temperature or the output of the vertical cavity surface emitting laser being changed. As shown in FIG. 19, side bands are generated on both sides of the carrier wave as a result of a modulation being carried out. The modulation is carried out at 4.6 GHz so that the frequency difference between the side bands coincides with 9.2 GHz that is the natural frequency of Cs atoms. As shown in FIG. 20, the maximum amount of laser light passes through the excited Cs gas when the side band frequency difference coincides with the natural frequency of Cs atoms. Accordingly, the modulator 460 is used to adjust the modulation frequency of the surface emitting laser element of the light source 410 in a feedback manner so that the output of the light detector 450 is maintained at the maximum value. Since the natural frequency of atoms is extremely stable, the modulation frequency has a stable value, and this information is taken as the output. It is noted that in a case where the wavelength is 894.6 nm, a wavelength in a range of ±1 nm (more preferably, ±0.3 nm) is needed.

According to the sixth embodiment, the atomic oscillator uses the surface emitting laser element according to any one of the first through fifth embodiments. As a result, it is possible to miniaturize an atomic oscillator. Further, by using the surface emitting laser element according to any one of the second through fifth embodiments, it is possible to produce an atomic oscillator at low cost. Further, by using the surface emitting laser element according to the fourth embodiment or the fifth embodiment, it is possible to provide an atomic oscillator having a longer life.

Further, according to the sixth embodiment, Cs is used as the alkali metal, and transition of the D1 line thereof is used. Thus, the vertical cavity surface emitting laser having the wavelength of 894.6 nm is used. However, 852.3 nm may be used in a case where the D2 line of Cs is used. Further, it is also possible to use Rb (rubidium) as the alkali metal. In this case, it is possible to use 795.0 nm in a case where the D1 line is used. It is also possible to use 780.2 nm in a case where the D2 line is used. The material composition or the like of the active layer can be designed depending on the wavelength. Further, as the modulation frequency in the case of using Rb, modulation is carried out at 3.1 GHz for $^{87}$Rb, and at 1.5 GHz for $^{85}$Rb. It is noted that also for these wavelengths, a wavelength in a range of ±1 nm is needed.

According to the embodiments described above, it is possible to provide a vertical cavity surface emitting laser having a wide divergence angle. Further, it is possible to provide a surface emitting laser element having a vertical cavity surface emitting laser(s) that emits light having a predetermined wavelength and a wide divergence angle. Further, it is possible to provide an atomic oscillator that can satisfy both miniaturization and high frequency stability. Further, it is possible to provide an atomic oscillator of low cost and high accuracy.

Although the surface emitting laser elements and the atomic oscillator have been described with reference to the embodiments, the present invention is not limited to the embodiments, and variations and modifications exist within the scope and spirit of the invention as described and defined in the following claims.

For example, according to the embodiments, the surface emitting laser element is used in the atomic oscillator. However, the surface emitting laser elements according to the second through fifth embodiments may also be used in other devices/apparatuses that need light of a predetermined wavelength such as a gas sensor. In this case, also in these devices/apparatuses, it is possible to obtain the same or similar advantageous effects by using laser light of predetermined wavelengths depending on particular uses emitted by the vertical cavity surface emitting lasers.

PATENT REFERENCE

Patent reference No. 1: Japanese Laid-Open Patent Application No. 2008-53353
Patent reference No. 2: Japanese Laid-Open Patent Application No. 2000-58958
Patent reference No. 3: Japanese Laid-Open Patent Application No. 11-330631
Patent reference No. 4: Japanese Laid-Open Patent Application No. 2008-283129
Patent reference No. 5: Japanese Laid-Open Patent Application No. 2009-188598
Patent reference No. 6: Japanese Laid-Open Patent Application No. 2002-208755
Patent reference No. 7: Japanese Patent No. 2751814

NON-PATENT REFERENCE

Non-patent reference No. 1: Applied Physics Letters, Vol. 85, pp. 1460-1462 (2004)
Non-patent reference No. 2: Comprehensive Microsystems, vol. 3, pp. 571-612
Non-patent reference No. 3: Proc. of SPIE Nol. 6132 613208-1 (2006)

The present patent application is based on Japanese Priority Application No. 2011-151279 filed Jul. 7, 2011, Japanese Priority Application No. 2012-099107 filed Apr. 24, 2012 and Japanese Priority Application No. 2012-144692 filed Jun. 27, 2012, the entire contents of which are hereby incorporated herein by reference.

The invention claimed is:

1. A surface emitting laser element, comprising:
  a lower DBR formed on a substrate;
  an active layer formed above the lower DBR;
  an upper DBR formed above the active layer; and
  a light shielding part disposed above the active layer and having an opening through which light that was generated in the active layer passes in a light emitting direction, wherein
  the upper DBR includes a dielectric multilayer that is made of dielectrics having different refractive indexes being alternately laminated and formed, and wherein
  an area of a cross-sectional opening region, which is bounded by the light shielding part encompassing a perimeter of the opening and is normal to the light emitting direction, is less than or equal to 30 $\mu m^2$, and
  the surface emitting element, as configured with the opening having the area less than or equal to 30 $\mu m^2$, emits laser light in a fundamental mode, and wherein light emitted from the opening has a divergence angle, at which the intensity of the light becomes $1/e^2$, greater than or equal to 20 degrees.

2. The surface emitting laser element as claimed in claim 1, wherein an area of the cross-sectional opening region is less than or equal to 20 $\mu m^2$.

3. The surface emitting laser element as claimed in claim 1, wherein the light shielding part is made of a metallic material or a material that absorbs the light.

4. The surface emitting laser element as claimed in claim 1, further comprising:
  a contact layer formed between the active layer and the dielectric multilayer of the upper DBR, wherein
  one electrode is connected with the contact layer.

5. The surface emitting laser element as claimed in claim 1, further comprising:
  a wavelength adjustment layer between the active layer and the dielectric multilayer of the upper DBR, wherein
  the surface emitting laser element includes plural vertical cavity surface emitting lasers that emit light of different wavelengths, respectively, as a result of a thickness of the wavelength adjustment layer being changed.

6. The surface emitting laser element as claimed in claim 5, further comprising:
a contact layer formed between the active layer and the wavelength adjustment layer, wherein
one electrode is connected with the contact layer.

7. The surface emitting laser element as claimed in claim 5, wherein the wavelength adjustment layer is formed of a film obtained from alternately laminating GaInP and GaAsP, or a film obtained from alternately laminating GaInP and GaAs, and the film thickness of the wavelength adjustment layer is changed as a result of a part of the film being removed for each layer.

8. An atomic oscillator, comprising:
the surface emitting laser element claimed in claim 1;
an alkali metal cell in which an alkali metal is sealed; and
a light detector that detects light transmitted by the alkali metal cell of light that is emitted by a vertical cavity surface emitting laser of the surface emitting laser element to the alkali metal cell, wherein
a modulation frequency is controlled using light absorption characteristics obtained from quantum interference effect caused by two different sets of resonance light, as a result of light of two different wavelengths of light that includes side bands emitted by the vertical cavity surface emitting laser being incident on the alkali metal cell.

* * * * *